US008989230B2

(12) United States Patent
Dummer et al.

(10) Patent No.: US 8,989,230 B2
(45) Date of Patent: Mar. 24, 2015

(54) METHOD AND APPARATUS INCLUDING MOVABLE-MIRROR MEMS-TUNED SURFACE-EMITTING LASERS

(71) Applicant: Vixar, Plymouth, MN (US)

(72) Inventors: Matthew M. Dummer, Minneapolis, MN (US); William Hogan, Minneapolis, MN (US); Mary K. Hibbs-Brenner, Plymouth, MN (US); Klein L. Johnson, Orono, MN (US); Garrett D. Cole, Mountain View, CA (US)

(73) Assignee: Vixar, Plymouth, MN (US)

( * ) Notice: Subject to any disclaimer, the term of this patent is extended or adjusted under 35 U.S.C. 154(b) by 0 days.

(21) Appl. No.: 13/729,166

(22) Filed: Dec. 28, 2012

(65) Prior Publication Data

US 2014/0064315 A1 Mar. 6, 2014

Related U.S. Application Data

(60) Provisional application No. 61/581,594, filed on Dec. 29, 2011.

(51) Int. Cl.
*H01S 5/183* (2006.01)
*H01S 5/026* (2006.01)
(Continued)

(52) U.S. Cl.
CPC .......... *H01S 5/18361* (2013.01); *H01S 5/0261* (2013.01); *H01S 5/18366* (2013.01); *H01S 5/183* (2013.01); *H01S 5/022* (2013.01);
(Continued)

(58) Field of Classification Search
CPC ..... H01S 5/022; H01S 5/183; H01S 5/18361; H01S 5/18366

USPC .................................................... 372/50.124
See application file for complete search history.

(56) References Cited

U.S. PATENT DOCUMENTS

| 5,893,722 A | 4/1999 | Hibbs-Brenner et al. |
| 5,903,588 A | 5/1999 | Guenter et al. |

(Continued)

FOREIGN PATENT DOCUMENTS

WO     03084010     10/2003

OTHER PUBLICATIONS

U.S. Appl. No. 61/208,200, filed Feb. 20, 2009, Brenner et al.
(Continued)

*Primary Examiner* — Julio J Maldonado
*Assistant Examiner* — Michael Carter
(74) *Attorney, Agent, or Firm* — Winthrop & Weinstine, P.A

(57) ABSTRACT

VCSEL apparatus having a substrate, a solid-state gain medium, a reflective mirror on one side of the medium, a movable reflective mirror on an opposite side of the medium, and a mechanism configured to move the movable mirror to tune a characteristic wavelength. Also described is a VCSEL apparatus having a silicon substrate having a slot therethrough and electrical connections formed on a first face, a substrate having VCSELs thereon and mounted across the slot and electrically connected to the electrical connections on the silicon substrate, and a glass substrate affixed to a second face of the silicon substrate. Also described is a VCSEL apparatus having a graded-index lens array having GRIN lenses mounted adjacently in a staggered arrangement, a PCB mounted to the lens array, and VCSEL chips mounted adjacently on the PCB and arranged so as to emit laser light through the lenses.

18 Claims, 31 Drawing Sheets

(51) Int. Cl.
  *H01S 5/022*  (2006.01)
  *H01S 5/02*   (2006.01)
  *H01S 5/06*   (2006.01)

(52) U.S. Cl.
  CPC ............ *H01S 5/0216* (2013.01); *H01S 5/0224* (2013.01); *H01S 5/0267* (2013.01); *H01S 5/0612* (2013.01); *H01S 5/18308* (2013.01); *H01S 5/18369* (2013.01)
  USPC ...................................... 372/50.124; 372/20

(56) References Cited

U.S. PATENT DOCUMENTS

| | | | |
|---|---|---|---|
| 6,665,109 B2 | 12/2003 | Little et al. | |
| 7,359,421 B2 | 4/2008 | Brenner et al. | |
| 7,557,470 B2 | 7/2009 | Culpepper et al. | |
| 7,719,693 B2 | 5/2010 | Osborn et al. | |
| RE41,738 E | 9/2010 | Brenner et al. | |
| 8,002,933 B2 | 8/2011 | Unger et al. | |
| 8,249,121 B2 | 8/2012 | Brenner et al. | |
| 8,494,018 B2 | 7/2013 | Brenner et al. | |
| 2002/0125324 A1* | 9/2002 | Yavid et al. | 235/462.45 |
| 2003/0031221 A1* | 2/2003 | Wang et al. | 372/45 |
| 2005/0271092 A1 | 12/2005 | Ledentsov et al. | |
| 2008/0279229 A1 | 11/2008 | Suzuki et al. | |
| 2009/0041464 A1 | 2/2009 | Ledentsov et al. | |
| 2009/0296754 A1 | 12/2009 | Ledentsov et al. | |
| 2010/0046565 A1 | 2/2010 | Masui et al. | |
| 2010/0220758 A1 | 9/2010 | Brenner et al. | |
| 2012/0120976 A1* | 5/2012 | Budd et al. | 372/34 |

OTHER PUBLICATIONS

U.S. Appl. No. 61/512,333, filed Jul. 27, 2011, Hibbs-Brenner et al.

M.C. Nowell et al. "Low-Chirp and Enhanced-Resonant Frequency by Direct Push-Pull Modulation of DFB Lasers." IEEE Journal Selected Topics of Quantum Electronics, vol. 1, No. 2, pp. 433-441, Jun. 1995.

J. Chen et al. "Dynamic Properties of Push-Pull DFB Semiconductor Lasers." IEEE Journal of Quantum Electronics, vol. 32, No. 12, pp. 2156-2165, Dec. 1996.

P. Pellandini et al. Dual-wavelength laser emission from a coupled semiconductor microcavity. Applied Physics Letters, vol. 71, No. 7, pp. 864-866, Aug. 18, 1997.

A.J. Fischer et al. "Coupled resonator vertical-cavity laser diode." Applied Physics Letters, vol. 75, No. 19, pp. 3020-3022, Nov. 8, 1999.

V. Badilita et al. "Rate-Equation Model for Coupled-Cavity Surface-Emitting Lasers." IEEE Journal of Quantum Electronics, vol. 40, No. 12, pp. 1646-1656, Dec. 2004.

A.C. Lehman et al. "Threshold Gain Temperature Dependence of Composite Resonator Vertical-Cavity Lasers." IEEE Journal Selected Topics of Quantum Electronics, vol. 11, No. 5, pp. 962-967, Sep./Oct. 2005.

D.M. Grasso et al. "Direct Modulation Characteristics of Composite Resonator Vertical-Cavity Lasers." IEEE Journal of Quantum Electronics, vol. 42, No. 12, pp. 1248-1254, Dec. 2006.

V.A. Shchukin et al. "Ultrahigh-speed electrooptically-modulated VCSELs: modeling and experimental results." in Proceedings of SPIE, vol. 6889, 2008.

J. van Eisen et al. "Optically Decoupled Loss Modulation in a Duo-Cavity VCSEL." IEEE Photonics Technology Letters, vol. 20, No. 1, pp. 42-44, Jan. 1, 2008.

C. Chen et al. "High-speed electroabsorption modulation of composite-resonator vertical-cavity lasers." IET Optoelectronics, vol. 3, No. 2, pp. 93-99, 2009.

C. Chen et al. "Multilevel Amplitude Modulation Using a Composite-Resonator Vertical-Cavity Laser." IEEE Photonics Technology Letters, vol. 21, No. 15, Aug. 1, 2009.

C. Chen et al. "Microwave Frequency Conversion Using a Coupled Cavity Surface-Emitting Laser." IEEE Photonics Technology Letters, vol. 21, No. 19, pp. 1393-1395, Oct. 1, 2009.

Bohr, Mark et al. "Intel's Revolutionary 22 nm Transistor Technology", Intel, May 2011 (28 pp.).

Chen, Chen et al. "Push-Pull Modulation of a Composite-Resonator Vertical-Capacity Laser", IEEE Journal of Quantum Electronics, vol. 46, No. 4, Apr. 2010 (pp. 438-446).

Young, E.W. et al. "Single-Transverse-Mode Vertical-Cavity Lasers Under Continuous and Pulsed Operation", IEEE Photonics Technology Letters, vol. 13, No. 9, Sep. 2001 (pp. 927-929).

International Search Report and Written Opinion for related PCT application PCT/US2012/048661, mailed Feb. 28, 2013 (8 pgs.).

Johnson, Klein et al. "Record High Temperature High Output Power Red VCSELs", Vixar, Photonics West 2011, Jan. 26, 2011 (14 pgs.).

Johnson, Klein et al. "Record High Temperature High Output Power Red VCSELs", SPIE Proceedings vol. 7952, 795208, Feb. 3, 2011 (12 pgs.).

\* cited by examiner

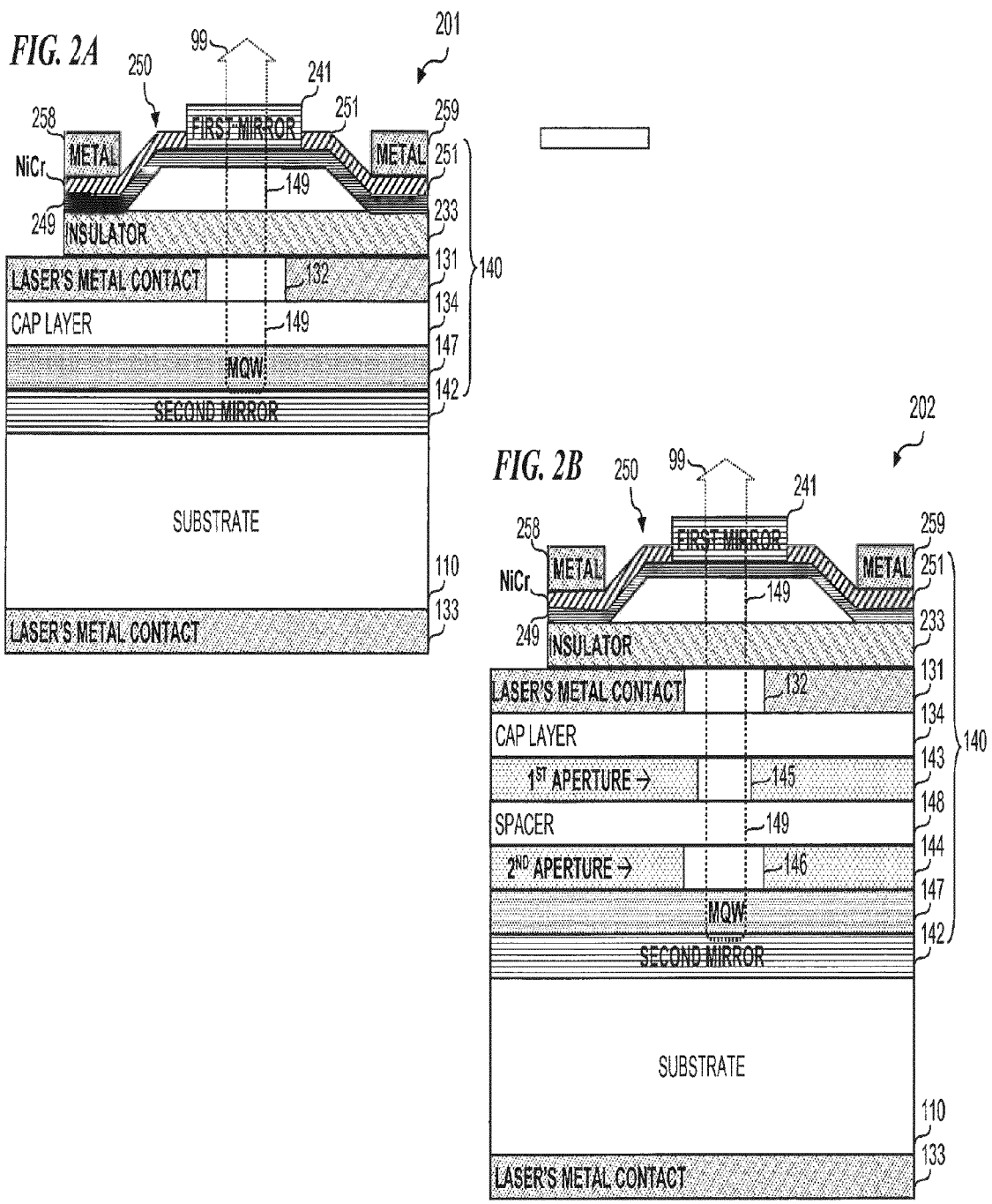

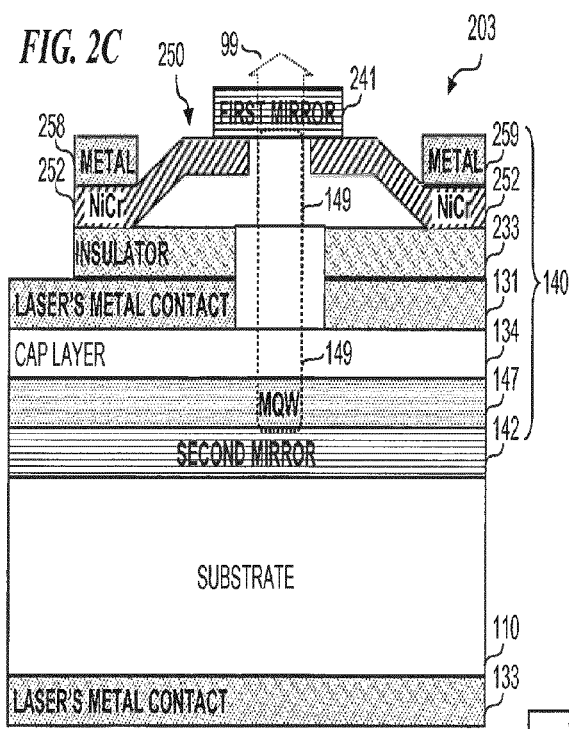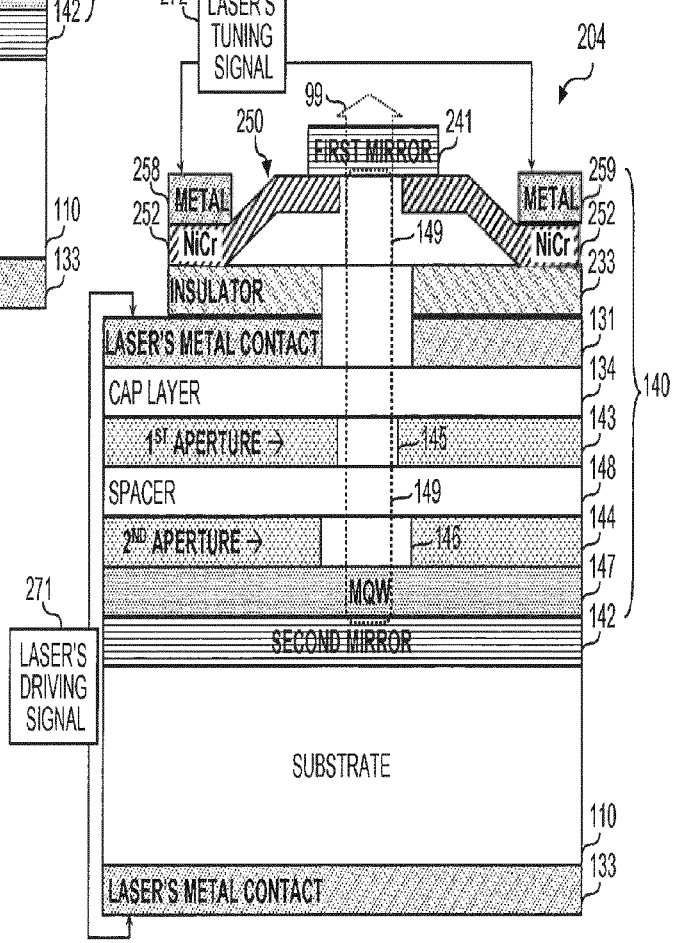

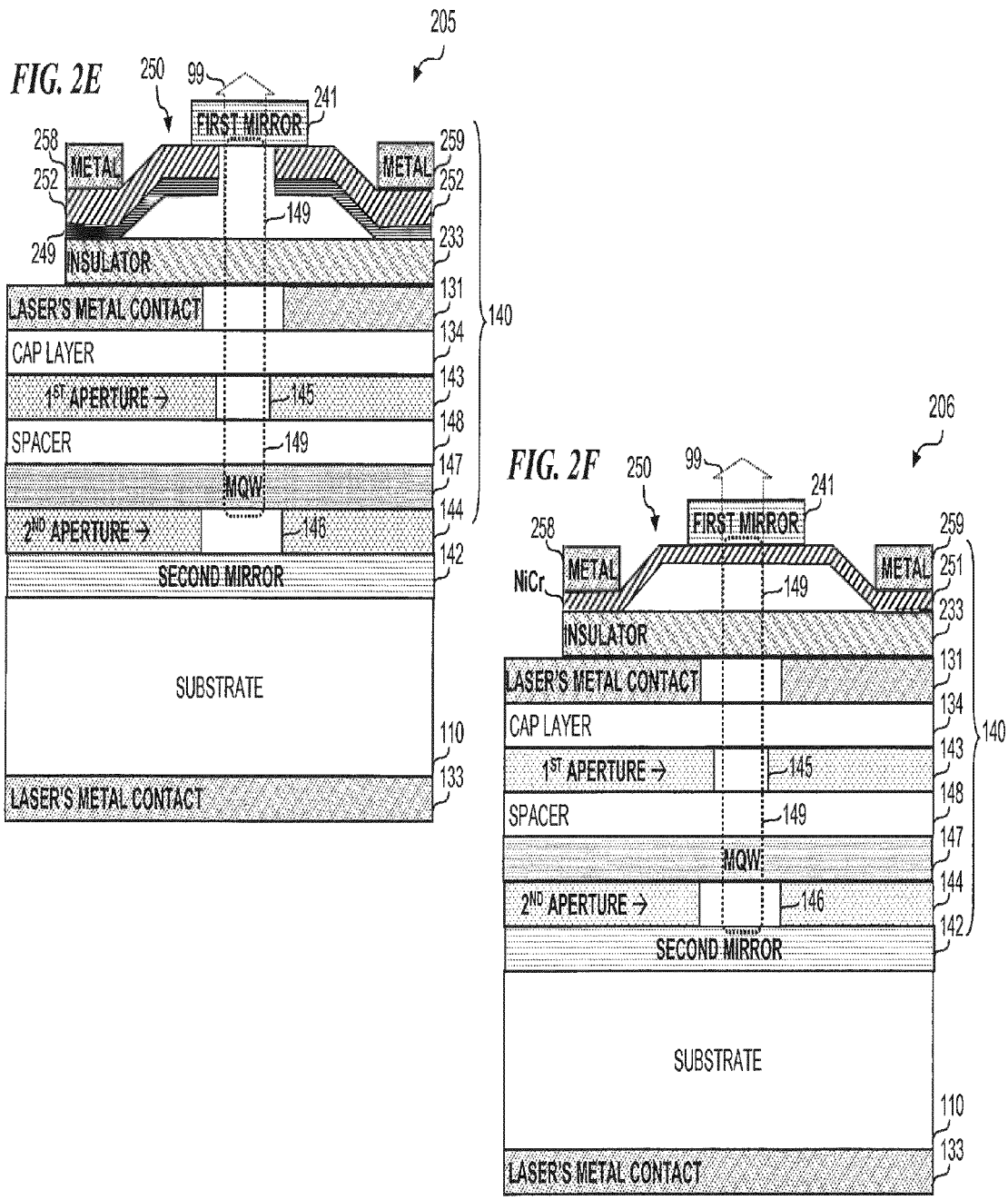

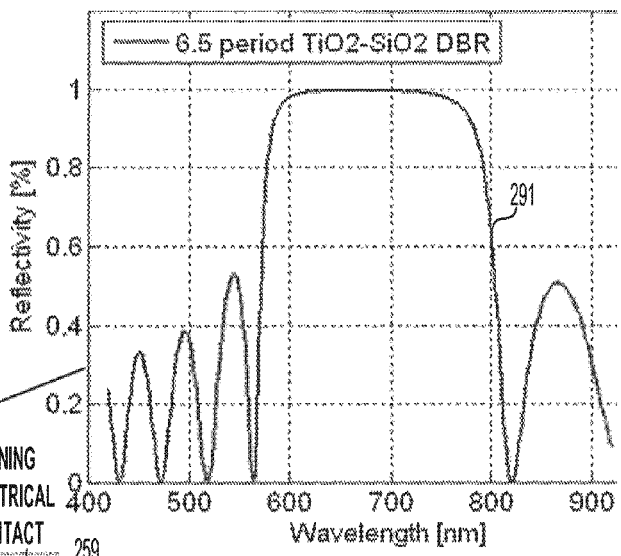
FIG. 2i-1 DIELECTRIC MIRROR
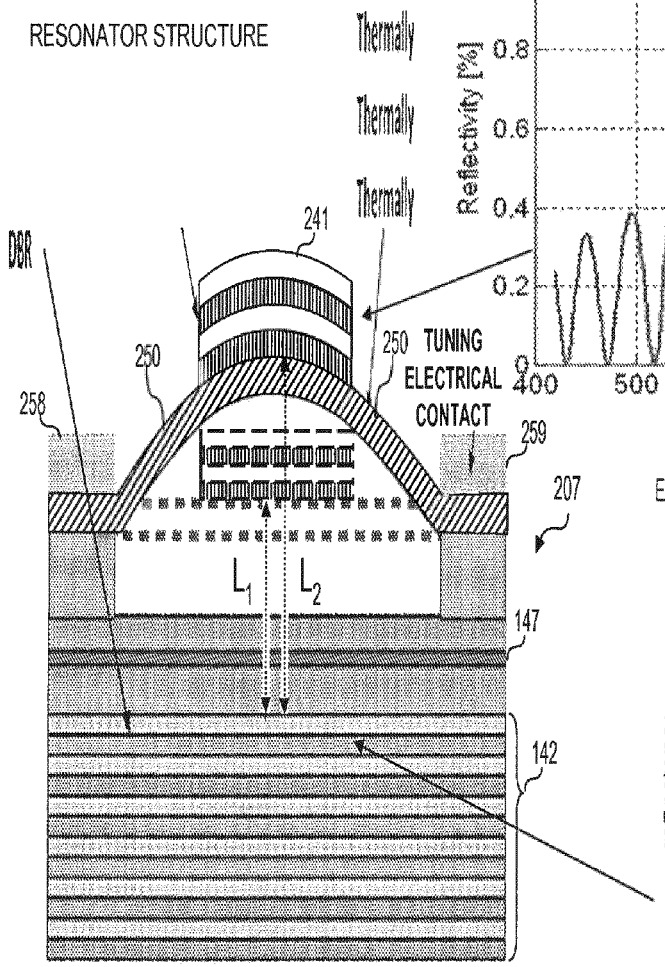
FIG. 2H
RESONATOR STRUCTURE
LASER CAVITY LENGTH INCREASES BY
$\Delta L = L_2 - L_1$ DUE TO DEFORMATION OF MEMBRANE
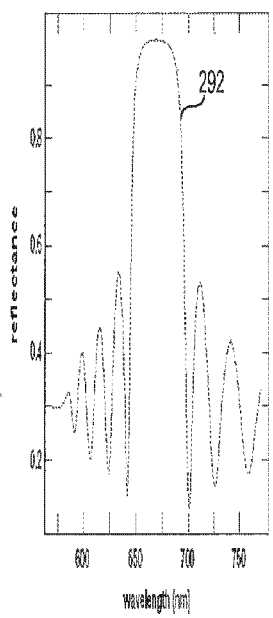
EPITAXIAL MIRROR FIG. 2J-1

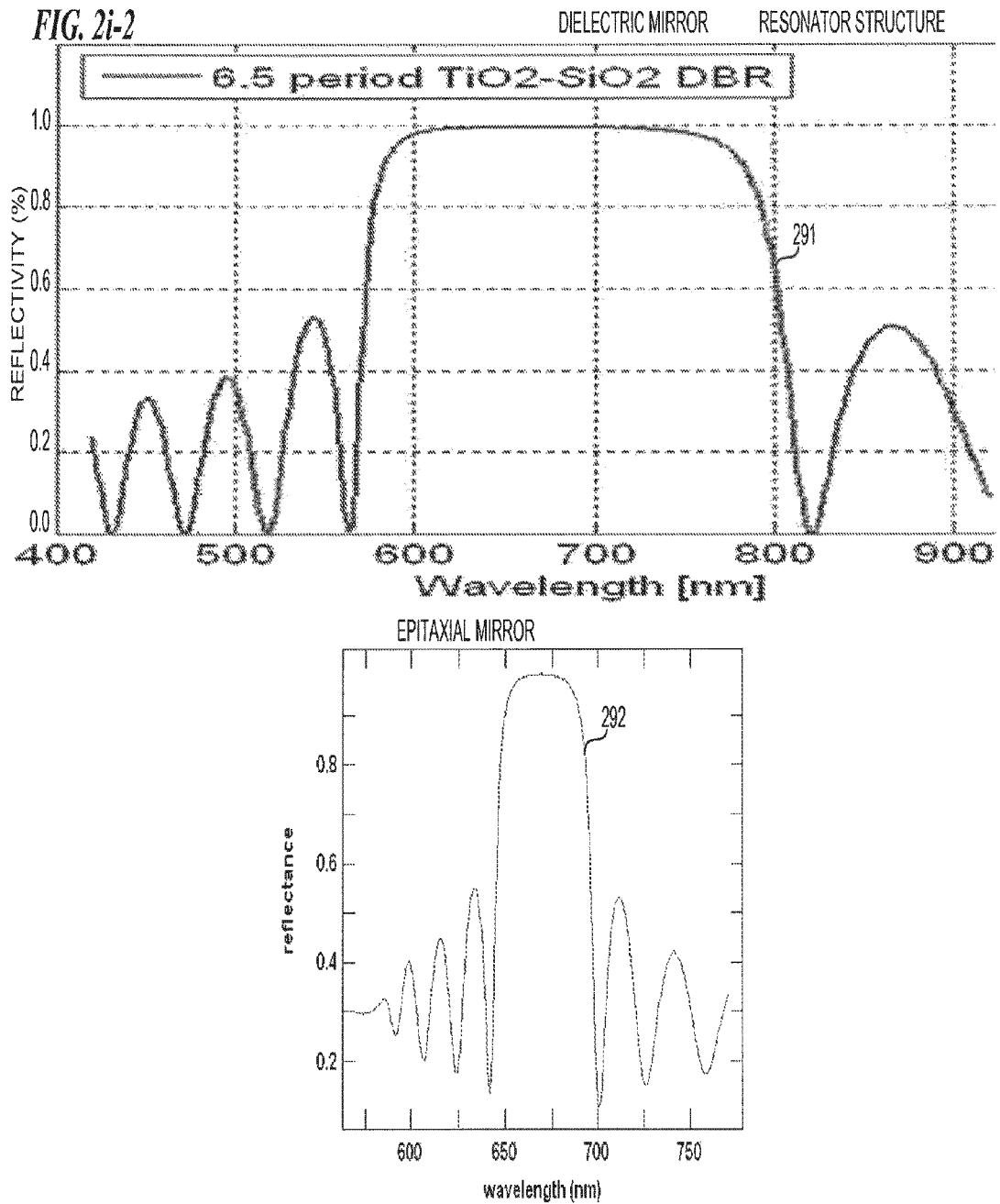

FABRICATION PROCESS
*FIG. 3B*
1) ion implantation
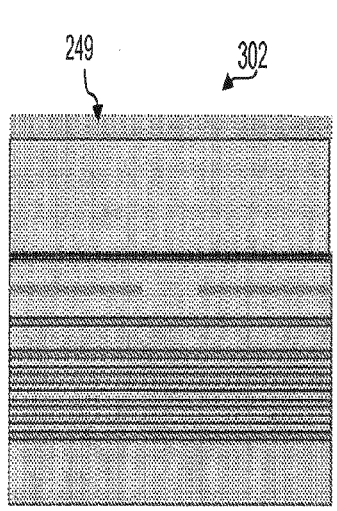
*FIG. 3C*
2) dielectric mirror
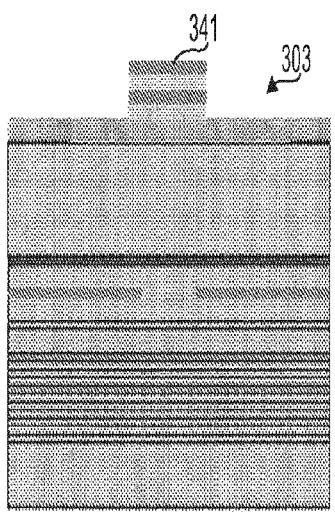
*FIG. 3D*
3) trench etch
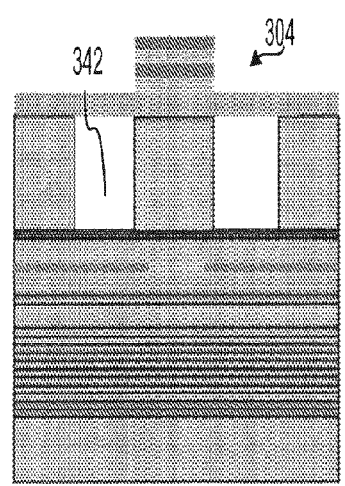
*FIG. 3E*
4) sidewall protection
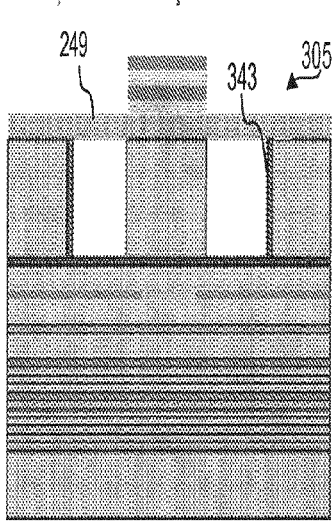
*FIG. 3F* nichrome and
5) ohmic contacts
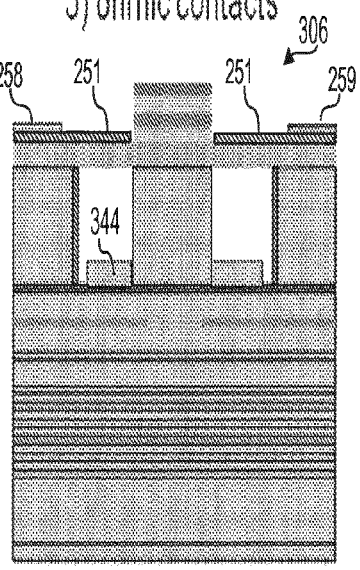
*FIG. 3G*
6) membrane release
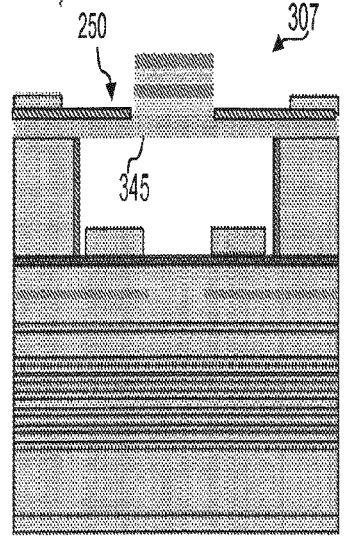

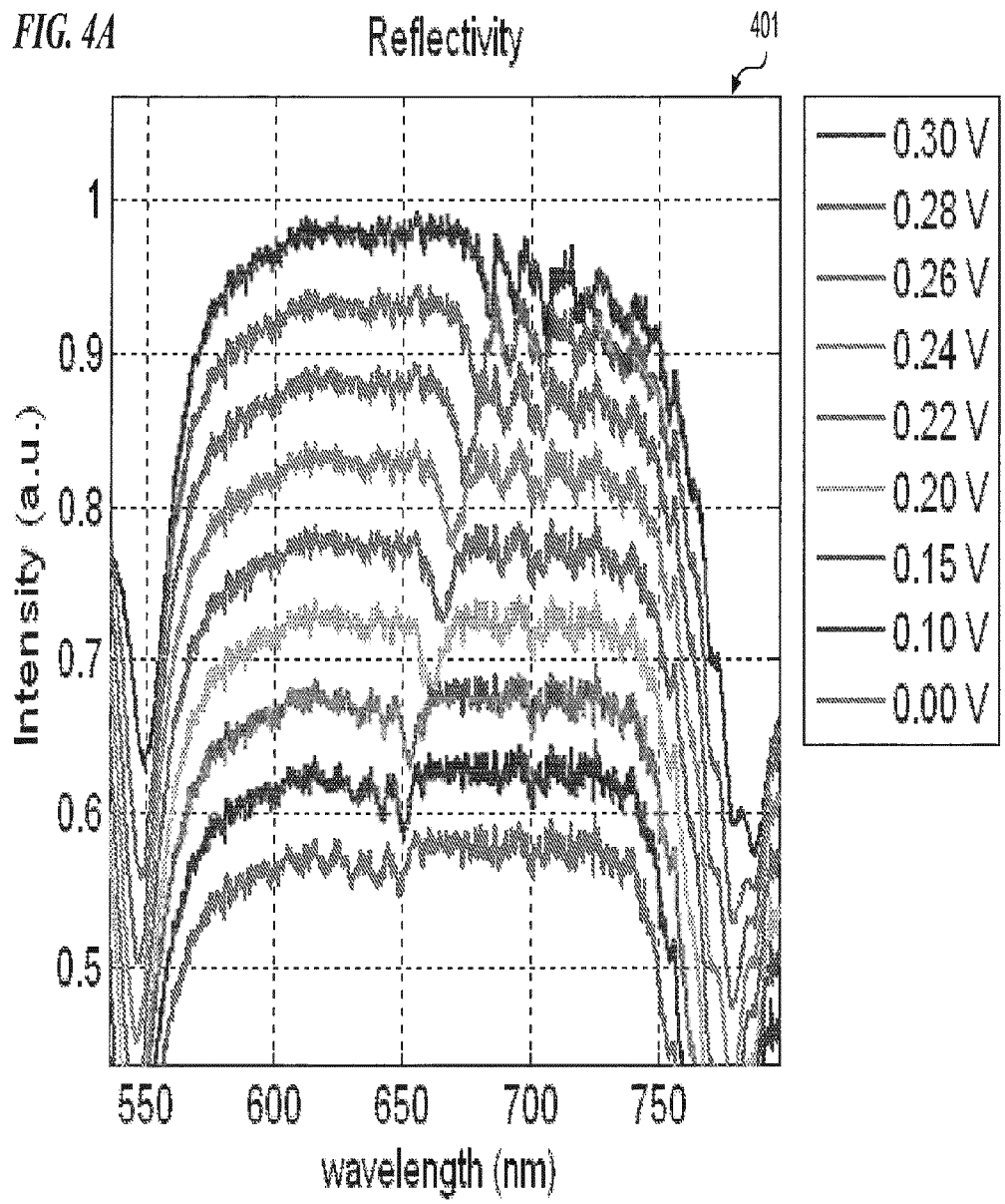

FIG. 5  SOME OF THE INVENTIVE FEATURES OF SOME EMBODIMENTS

MONOLITHIC DEVICE INCORPORATING VCSEL AND TUNING ELEMENT ON SINGLE CHIP

SECOND MIRROR IS SUSPENDED OVER THE VCSEL BOTTOM MIRROR AND ACTIVE LAYER WITH AN AIR SPACE IN BETWEEN

SEMICONDUCTOR ARMS CONNECT THE SUSPENDED MIRROR TO THE REST OF THE STRUCTURE

RESISTIVE HEATERS CONSISTING OF A HIGHER RESISTANCE METAL, LIKE NiCr PATTERNED ON THE CONNECTOR ARMS CAUSE THE ARMS TO EXPAND AND THE MIRROR TO MOVE UP RELATIVE TO THE BOTTOM PART OF THE STRUCTURE; AS THE MIRROR MOVES, THE VCSEL WAVELENGTH SHIFTS TO LONGER WAVELENGTHS

EPITAXIAL STRUCTURE CONSISTS OF SUBSTRATE, BOTTOM SEMICONDUCTOR MIRROR, QW ACTIVE LAYER, ETCH STOP, AlAs SACRIFICIAL LAYER, AND AlGaAs MEMBRANE

PROCESSING CONSISTS OF ION IMPLANTATION TO FORM CURRENT CONFINEMENT GUIDE, DEPOSITING AND PATTERNING SEMICONDUCTOR MIRROR, TRENCH ETCH, PASSIVATING OUTSIDE SIDEWALLS OF TRENCH, DEPOSITING OHMIC METAL CONTACTS ON TOP OF ACTIVE REGION, PATTERNING THE RESISTIVE METAL ON THE TOP MIRROR CONNECTOR ARMS, AND ETCHING THE SACRIFICIAL LAYER TO RELEASE THE TOP MIRROR. ALSO THINNING WAFER AND DEPOSITING METAL ON BACK SIDE

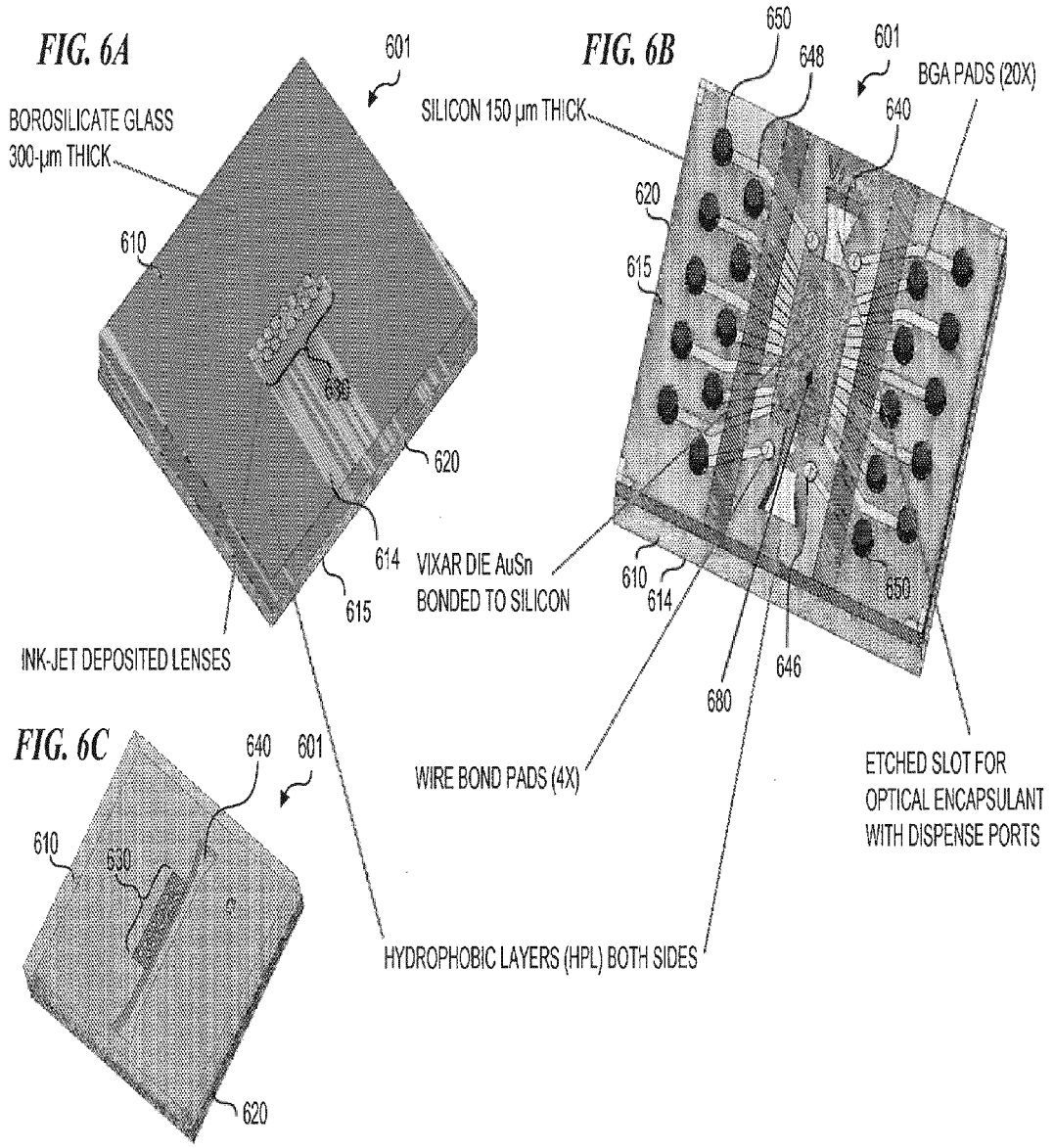

CROSS SECTION VIEW

FIG. 6E1
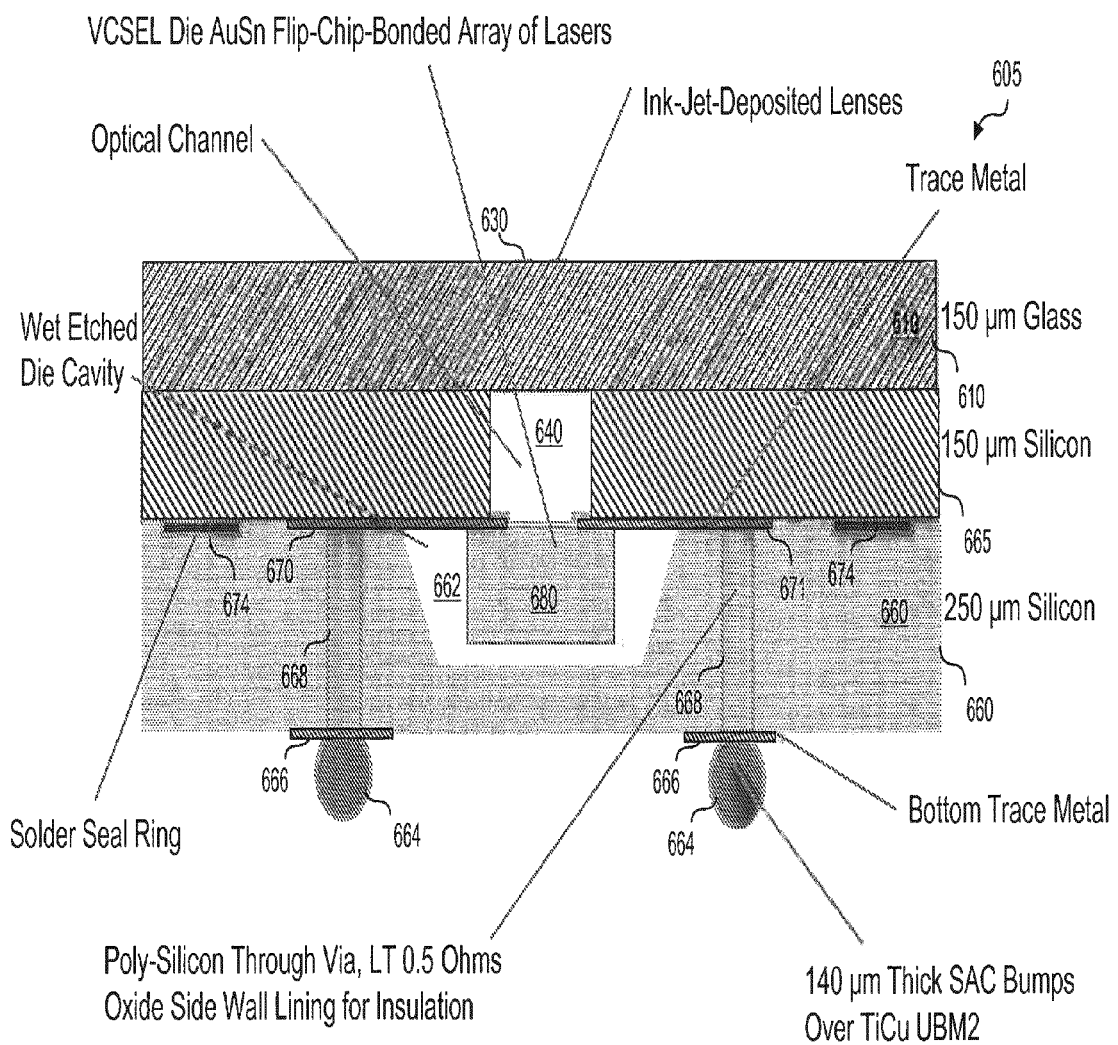

*FIG. 6E2*
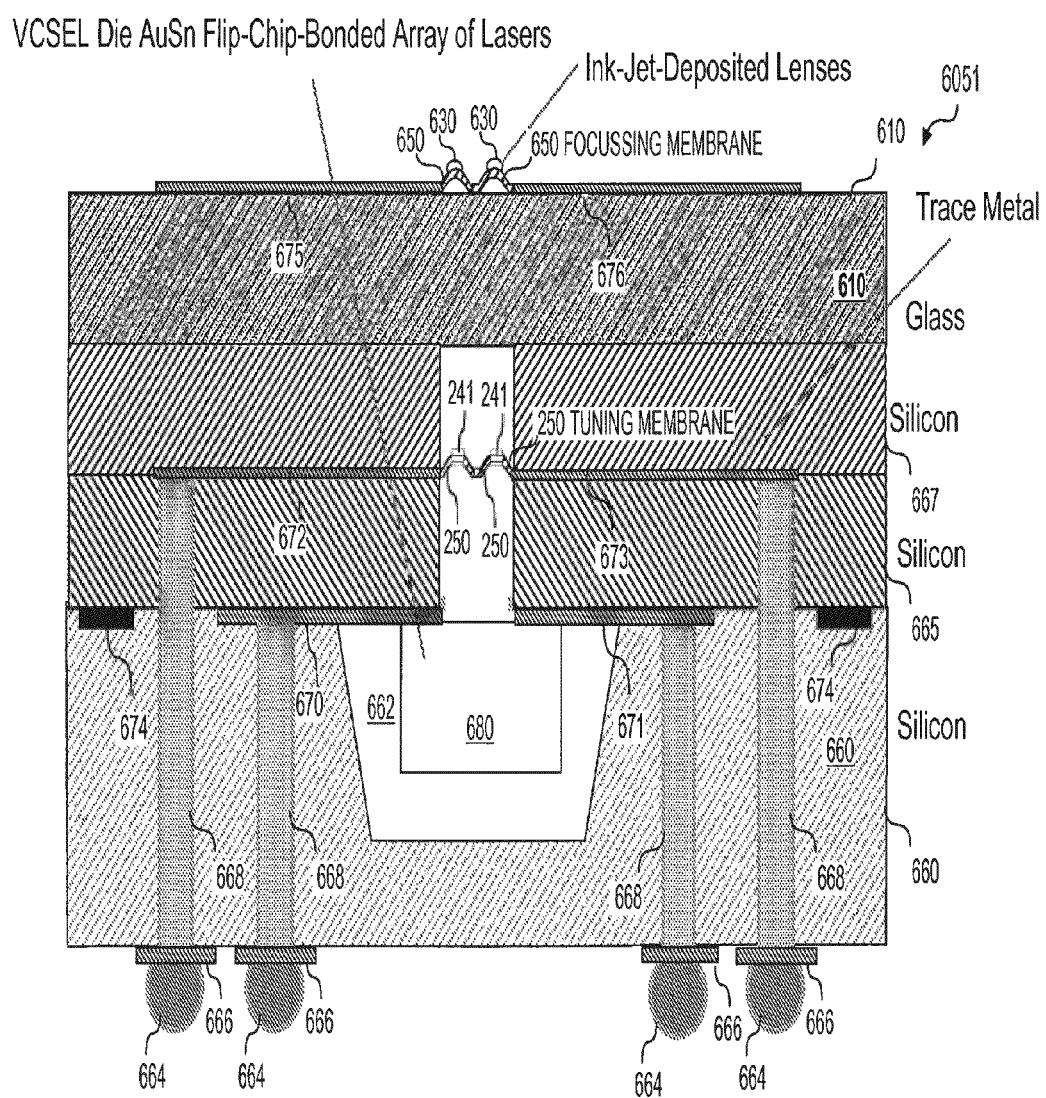

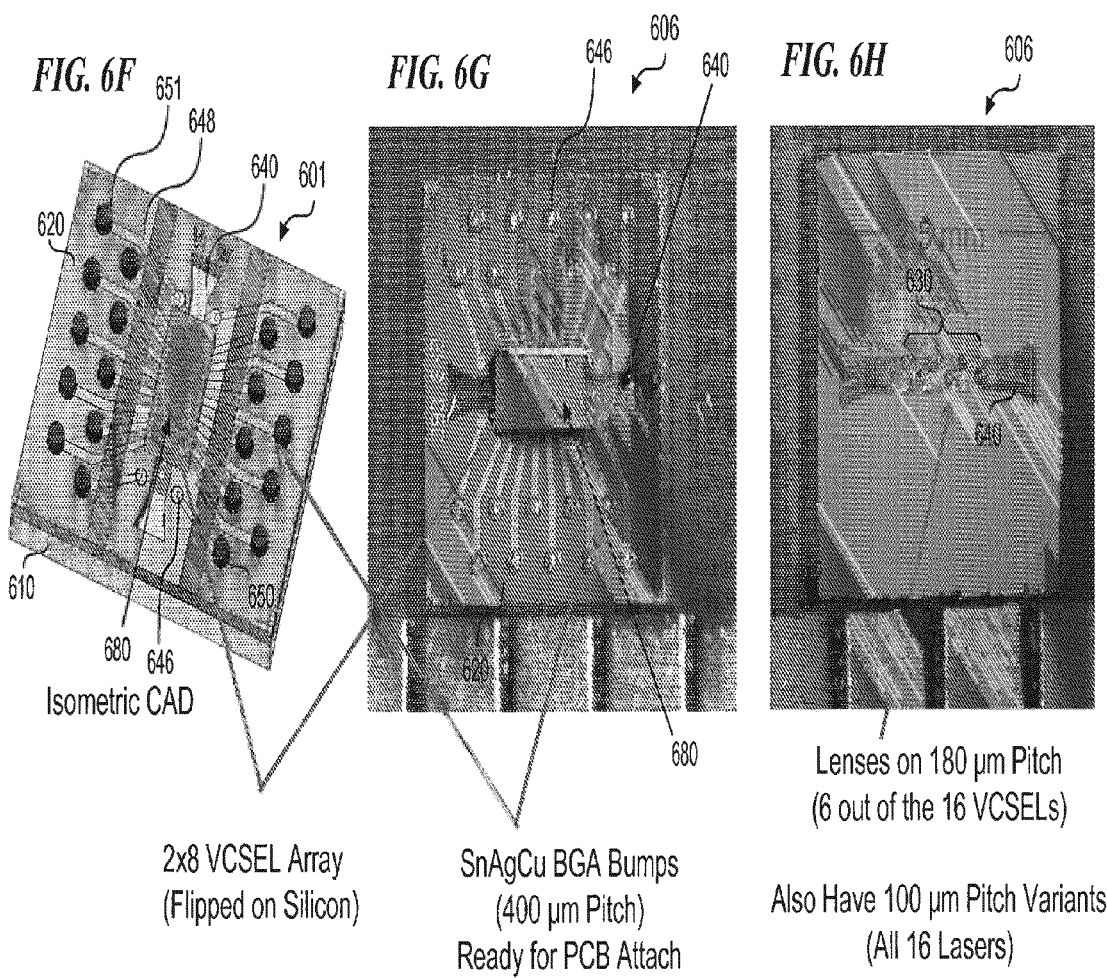

FIG. 7A  FIG. 7B  FIG. 7C
Focused on Apertures  Focused on VCSELs  Focused on VCSEL Image (Relay Lens)
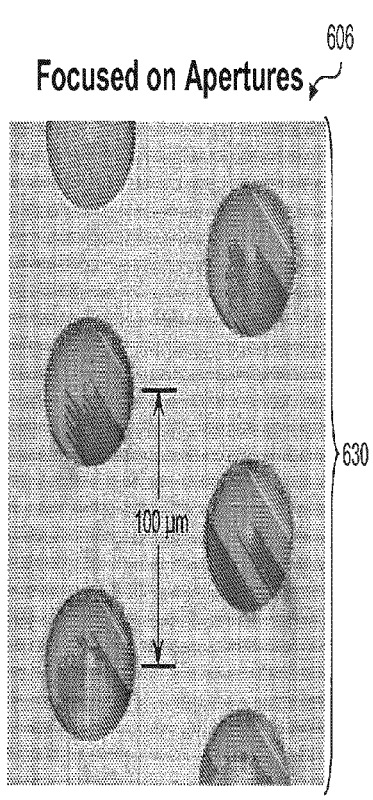
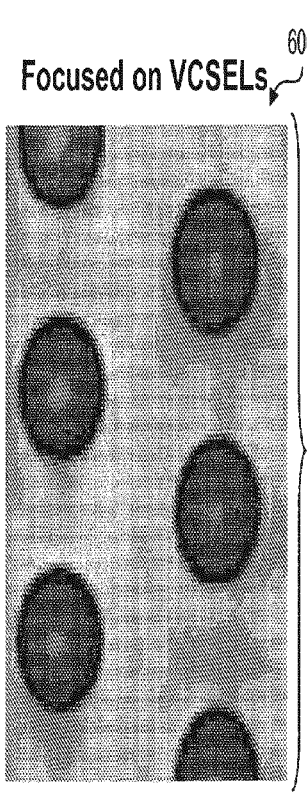
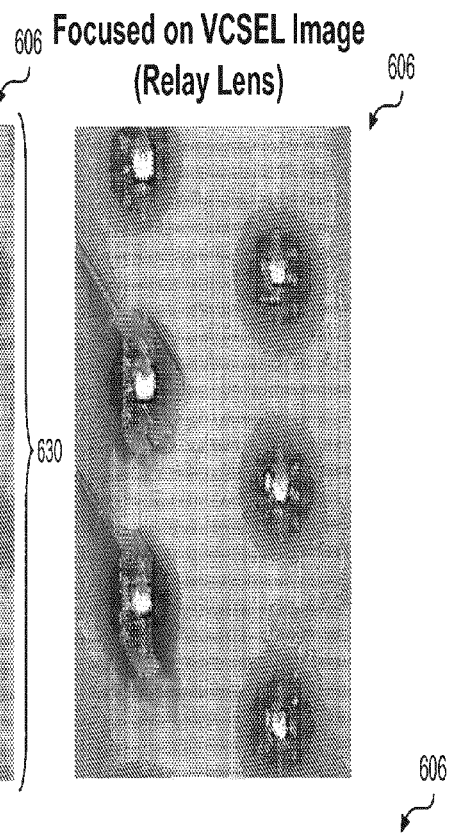
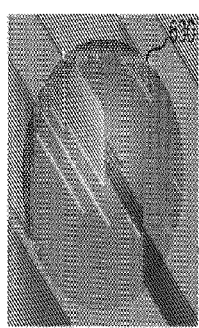
Micro-Lens Arrays on 100 & 180 µm Pitch.
Lens Diameters = down to 61 µm.
Individual Lens, Focal Properties as req'd.
FIG. 7D
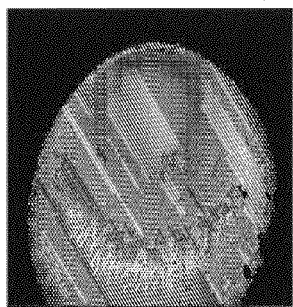
FIG. 7E

FIG. 8

WAFER SCALE PACKAGE DESCRIPTION AND INVENTIVE FEATURES OF SOME EMBODIMENTS

WAFER SCALE PACKAGE: THOUSANDS OF PACKAGES FABRICATED SIMULTANEOUSLY ON A SILICON WAFER

SILICON WAFER BONDED TO GLASS WAFER – GLASS WAFER CARRIES THE LENSES

A SLOT IS ETCHED INTO THE SILICON WAFER TO ALLOW THE LIGHT FROM THE VCSEL TO PASS THROUGH THE SILICON WAFER AND THEN THROUGH THE TRANSPARENT GLASS

THE ETCHED SLOT ALSO ALLOWS US TO INJECT A TRANSPARENT ENCAPSULANT TO PROTECT THE SURFACE

IN SOME EMBODIMENTS LENSES ARE FABRICATED BY INKJET PRINTING OF BUMPS OF LIQUID POLYMER THAT IS THEN HARDENED (THIS IS WHAT WE HAVE DEMONSTRATED). IN SOME OTHER EMBODIMENTS, LENSES ARE FABRICATED BY ETCHING INTO THE GLASS TO FORM REFRACTIVE OR DIFFRACTIVE LENSES. IN OTHER EMBODIMENTS, A HOLOGRAPH PROCESS IS USED TO FORM FOCUSSING ELEMENTS.

LENS COULD EITHER BE A REFRACTIVE OR DIFFRACTIVE LENS

VCSEL DIE CAN BE A SINGLE LASER OR AN ARRAY AND IS BUMP-BONDED TO THE SILICON WAFER WHILE STILL IN WAFER FORM

AFTER SAWING THE SILICON WAFER INTO INDIVIDUAL PACKAGES, THE SILICON PACKAGE CAN BE SURFACE MOUNTED TO THE BOARD (ANOTHER BUMP BOND)

THE LENSES ARE ALIGNED TO THE VCSELS WITH PHOTOLITHOGRAPHIC PRECISION AT THE WAFER SCALE

THE PACKAGE CAN BE MADE HERMETIC BY USING A SECOND SILICON WAFER WITH A WELL ETCHED INTO IT AND WITH THROUGH WAFER CONTACTS

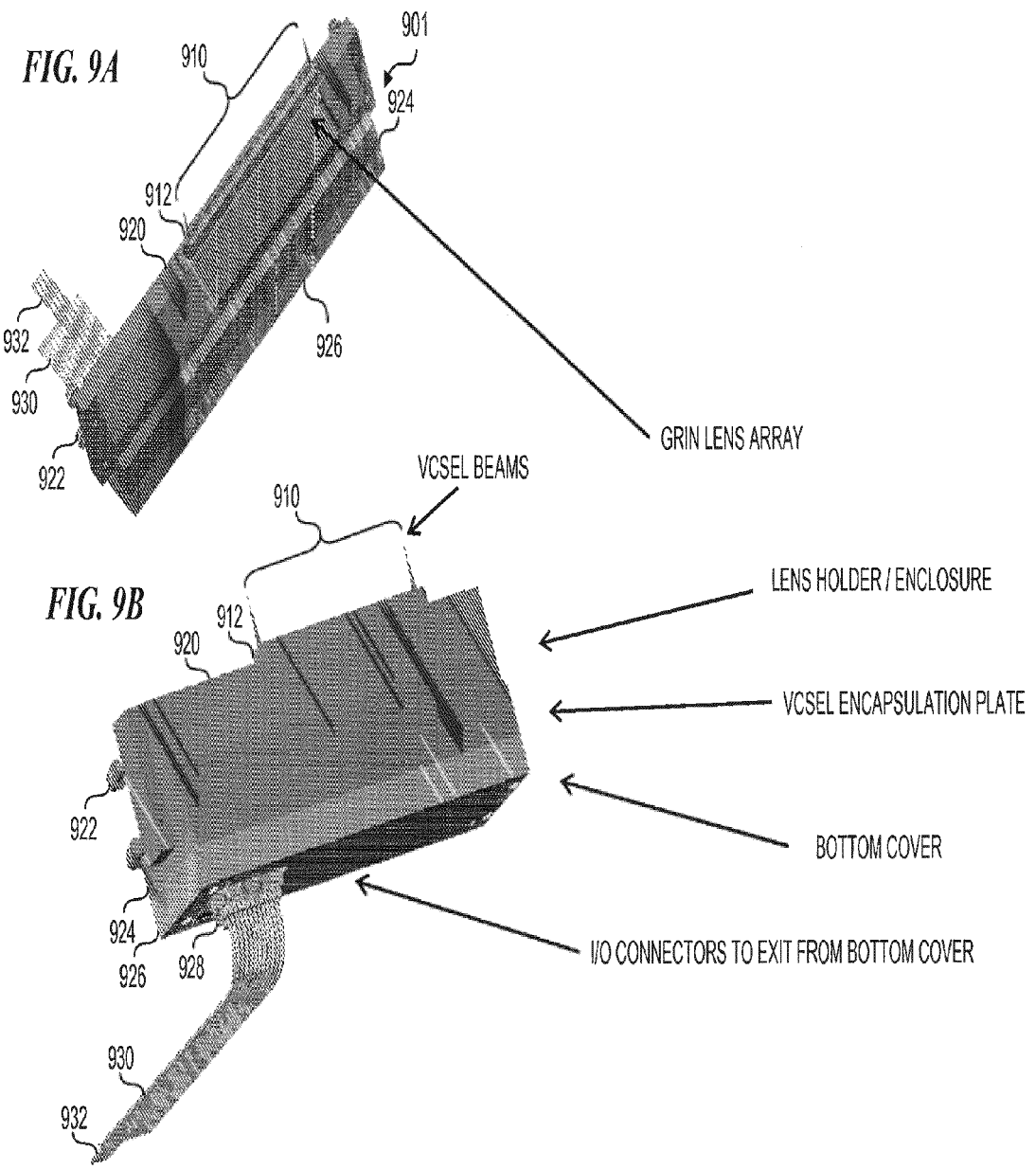

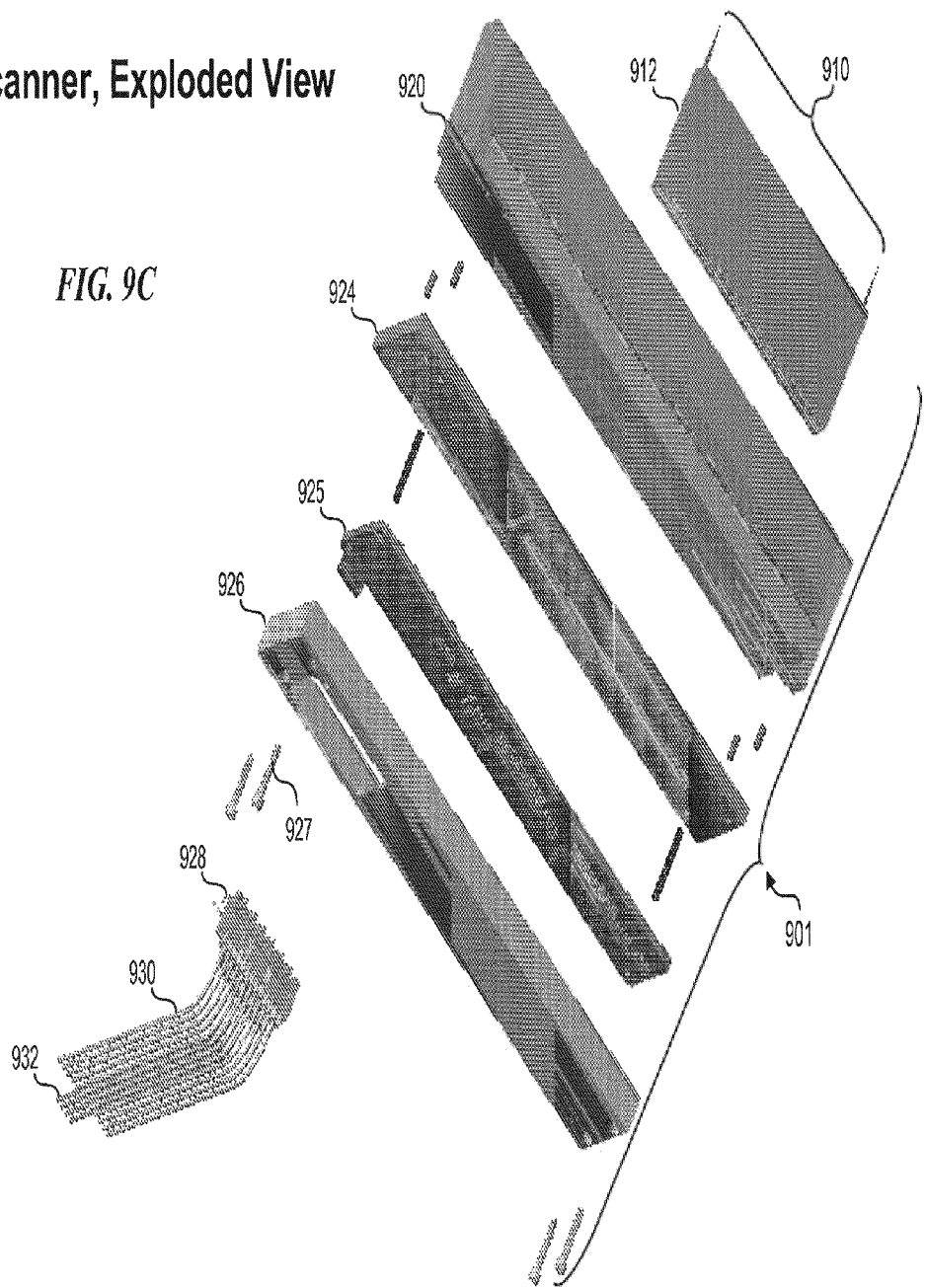

FIG. 9D
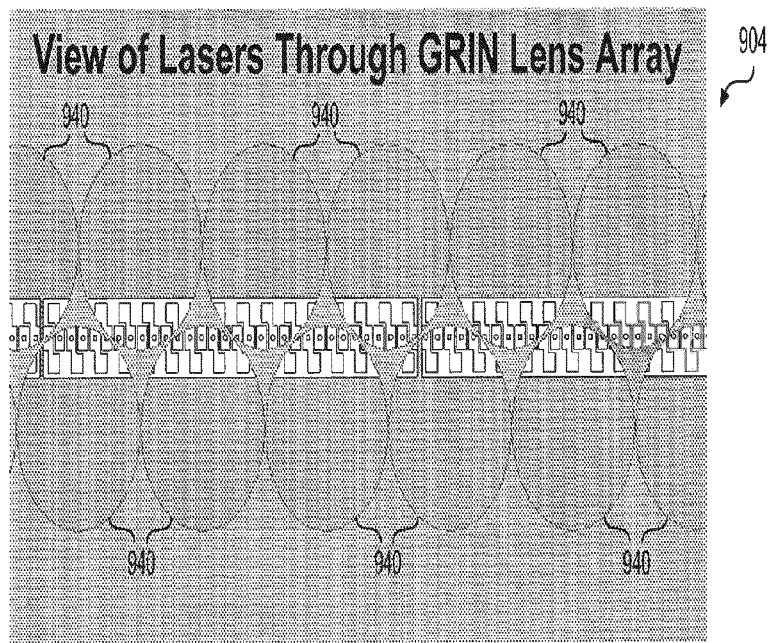
Two Row Selfoc™ GRIN Lens Array, Centered Over the VCSEL Array
FIG. 9E VCSEL Arrays on 100 μm Pitch with 20 μm Gap Between Die
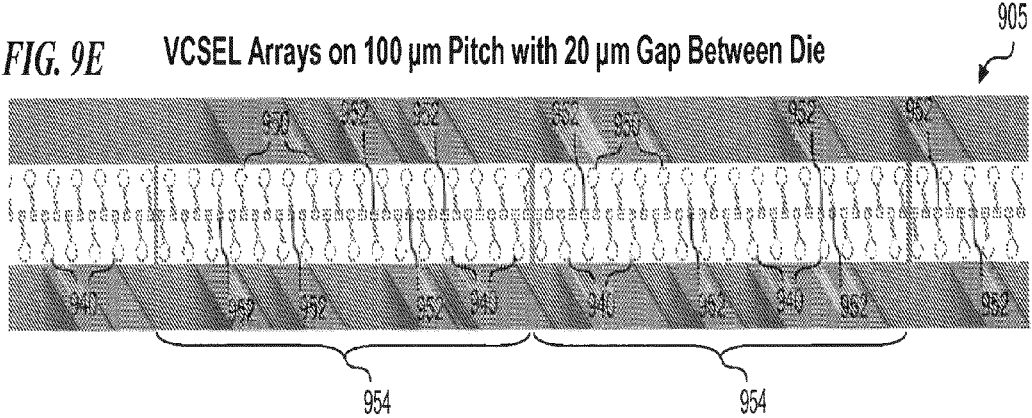

The circuit board with the 2" scanning VCSEL array and drive electronics (No lens array in this picture)

Pictures of the VCSEL array on the board, showing the alignment from one 1x32 VCSEL chip to the next

FIG. 10

SCANNER INVENTIVE FEATURES OF SOME EMBODIMENTS

USES VCSEL ARRAYS (1X8, 1X16, 1X32, OR 1X64 OPTIMAL)

THE VCSEL ARRAYS ARE PLACED END TO END IN A LINE DIRECTLY ON A BOARD; THE PITCH IS MAINTAINED ACROSS CHIP EDGES TO BETTER THAN 10 μm (10 MICRONS)

ALIGNMENT MARKS ON THE CHIPS AND ALIGNMENT MARKS ON THE BOARD ALLOW THE CHIPS TO BE PLACED SO THAT THE VCSEL TO VCSEL ALIGNMENT REMAINS CONSTANT ACROSS CHIP EDGES

THE VCSEL CHIPS ARE EITHER SAWN OR CLEAVED IN THE LONG DIRECTION, AND ARE CLEAVED IN THE SHORT DIRECTION TO ENABLE THEM TO BE PLACED CLOSE TOGETHER ON THE BOARD

A GRIN LENS ARRAY IS ALIGNED TO THE VCSELS TO FOCUS THE BEAM; THE GRIN LENS ARRAY IS IMAGING SO THAT ALL LIGHT FROM A GIVEN VCSEL IS FOCUSSED TO THE SAME SPOT, REGARDLESS OF WHICH LENS THE LIGHT TRAVELLED THROUGH

A MATRIX ADDRESSING DRIVER SCHEME ALLOWS EACH VCSEL TO BE TURNED ON SEQUENTIALLY

A 100 μm (100 MICRONS) PITCH HAS BEEN MAINTAINED.

METHOD AND APPARATUS INCLUDING MOVABLE-MIRROR MEMS-TUNED SURFACE-EMITTING LASERS

CROSS-REFERENCE TO RELATED APPLICATIONS

This application claims priority to U.S. Provisional Application No. 61/581,594, filed Dec. 29, 2011, titled "METHOD AND APPARATUS INCLUDING MOVABLE-MIRROR MEMS-TUNED SURFACE-EMITTING LASERS," and is related to U.S. patent application Ser. No. 12/710,156, filed Feb. 22, 2010, titled "DIRECT MODULATED MODIFIED VERTICAL CAVITY SURFACE EMITTING LASERS"; U.S. patent application Ser. No. 13/163,434, filed Jun. 17, 2011, titled "PUSH-PULL MODULATED COUPLED VERTICAL-CAVITY SURFACE-EMITTING LASERS AND METHOD"; U.S. patent application Ser. No. 13/162,991, filed Jun. 17, 2011, titled "DIRECT MODULATED MODIFIED VERTICAL-CAVITY SURFACE-EMITTING LASERS AND METHOD"; U.S. Provisional Application No. 61/208,200 filed on Feb. 20, 2009, titled "DIRECT MODULATED MODIFIED VERTICAL CAVITY SURFACE EMITTING LASERS"; and U.S. Provisional Application No. 61/512,333 filed on Jul. 27, 2011, titled "METHOD AND APPARATUS INCLUDING IMPROVED VERTICAL-CAVITY SURFACE-EMITTING LASERS," each of which are incorporated herein by reference in their entirety.

FIELD OF THE INVENTION

The present invention relates to a tunable output solid state laser and, more particularly, to a tunable-output vertical-cavity surface-emitting solid-state laser that uses a movable suspended mirror for adjusting the length of the cavity of the laser.

BACKGROUND OF THE INVENTION

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Tunable lasers provide benefits to spectroscopy, atomic absorption based sensors, medical sensors and imaging and gas sensing. In these types of applications it is desirable to either sweep through a range of wavelengths in order to detect an absorption or fluorescence feature, or to tune very precisely to a particular wavelength. For instance, the absorption characteristics of different kinds of hemoglobin and water is used to sense the oxygenation of blood, as well as image the functioning of the brain or characteristics of tumors. Currently such systems used a limited number of discrete wavelengths in the wavelength range from 650-1000 nm to sample the absorption spectrum over that range. However, a device (or devices) that allow tuning over the full range would provide much more detailed information about the absorption spectrum. For sensors such as an atomic clock, the wavelength required for absorption in the atom (typically cesium or rubidium) must be much more precise than one can typically fabricate or screen for. Some tuning is required. A limited amount of tuning can be achieved by changing the current (which also results in a power change) or temperature, but practically the tuning range is limited to a couple of nanometers. A tunable device could result in a much better yield of lasers designed for this application.

Vertical cavity surface emitting lasers (VCSELs) have been widely used in short transmission distance optical networks, optical interconnects and optically based computer mice. They are now beginning to be applied more widely to consumer electronics, sensors and imaging. For miniaturized, portable, battery-driven or wearable devices, VCSELs offer the benefits of low power consumption, and very compact packaging. Other performance advantages include a very narrow linewidth, narrow beam divergence, and high modulation speed. However, other than the current or temperature tuning mentioned above, tunable VCSELs are not available. Therefore an adaptation of the conventional VCSEL structure that allows for tuning over 10's of nanometers would be advantageous for a variety applications.

Another issue in the application of VCSELs is the ability to package them effectively and combine them with lenses in a manner that allows for the efficient alignment of the VCSELs and the lenses. This is particularly important for the case where there are arrays of VCSELs combined with arrays of microlenses. Therefore, a wafer scale packaging approach that allows for the global alignment of a wafer full of lenses with a wafer of VCSEL packages would be beneficial.

One of the advantages of VCSELs over other types of semiconductor lasers is the ease with which multiple VCSELs can be integrated onto the same chip. However, the size of a given chip is limited by the ability to produce an array with good yield and uniformity. Some applications of interest in the application of VCSEL arrays include scanning across a large area. A long array of VCSELs can be used to perform the scanning without moving parts. However, the challenge in developing such a scanner is the ability to package multiple VCSEL array chips together in such a way that it creates a long array of VCSELs with a uniform pitch.

BRIEF SUMMARY OF THE INVENTION

In some embodiments, the present invention provides a VCSEL system having a movable mirror structure as part of the VCSEL chip. In some embodiments, the present invention provides a monolithic device incorporating a VCSEL and tuning element on a single chip. The VCSEL has a first mirror at one end of the cavity and a second mirror at an opposite end of the cavity. In some embodiments, the second mirror is formed inside the solid VCSEL and the first mirror is suspended over the VCSEL active layer and the second mirror, with an air space in between the first mirror and the rest of the active device. In some embodiments, flexible semiconductor and/or nichrome (or other resistive material) arms connect the suspended first mirror to the rest of the structure. In some embodiments, resistive heaters that include a higher resistance metal, such as NiCr or the like, are patterned on the connector arms and cause the arms to controllably expand and contract and move the mirror up and down relative to the bottom part of the structure. As the mirror moves up relative to the bottom part of the structure, the VCSEL wavelength progressively shifts to longer wavelengths, within a given range. In some embodiments, after reaching the end of the given range, the resonant wavelength jumps back to a shorter wavelength, and from there again progressively shifts to longer wavelengths, within the second range. In some embodiments, the VCSEL device includes an epitaxial structure that includes a substrate, a bottom semiconductor mirror, a quantum-well (qw) active layer, an etch stop, an AlAs sacrificial layer, and AlGaAs membrane that holds a multilayer diffractive mirror (the movable first mirror). In some embodiments, processing includes ion implantation to form current-confinement guide, depositing and patterning semiconductor mirror, trench etching, passivating outside sidewalls of trench, depositing ohmic metal contacts on top of active region, patterning the resistive metal on the top mirror connector arms, and etching to remove the sacrificial layer under the suspension arms and the top mirror to release the top mirror. Some embodiments also include thinning the wafer and depositing metal on its back side.

In some embodiments, the present invention includes a wafer-scale package for a VCSEL device. In some embodiments, the wafer-scale package includes a plurality of devices (e.g., dozens, hundreds, or even thousands of packages fabricated simultaneously on a silicon wafer. In some embodiments, the silicon wafer is bonded to a glass wafer, wherein the glass wafer carries the lenses used to focus or collimate the light from the plurality of VCSELs. In some embodiments, a slot is etched into the silicon wafer to allow the light from the VCSEL device to pass through the slot in the silicon wafer and then through the transparent glass and the lenses formed thereon. In some embodiments, the etched slot also allows injection of a transparent encapsulant to protect the surface of the VCSEL chip(s). In some embodiments, the lenses are fabricated by inkjet printing of a refractive material such as a polymer that is transparent to the light from the VCSELs. In other embodiments, the present invention includes etching the lenses into the glass rather than ink-jet deposition of polymer in those cases where it is desired to have an all-glass emission surface. In some embodiments, the lenses are refractive lenses, while in other embodiments, the lenses are diffractive or holographic lenses. In some embodiments, the VCSEL die includes just a single laser, while in other embodiments, an array of VCSELs is formed on each chip. In some embodiments, each chip is bump-bonded to the silicon wafer while still in wafer form. In some embodiments, after sawing and/or cleaving the silicon wafer into individual packages, the silicon package is surface mounted to a printed-circuit board, for example, using another bump bond. In some such embodiments, the printed-circuit board is made using a conventional composite material (e.g., epoxy and fiberglass), while in some other embodiments, a silicon wafer having conductive traces formed thereon is used. In some embodiments, the lenses deposited on or formed in the transparent glass are aligned to the VCSELs with photolithographic precision at the wafer scale by alignment to fiducial marks on the silicon that has the slots. In some embodiments, the package is made such that it is hermetically sealed by using a second silicon wafer having a well or other recess etched into it and, in some embodiments, having through-wafer contacts to the leads carrying power to the VCSELs.

In some embodiments, the present invention includes a packaging configuration for VCSELs to be used in a scanner. In some embodiments, the package uses VCSEL arrays (1×8, 1×16, 1×32, or 1×64 may be optimal in some embodiments). In some embodiments, the package uses staggered VCSEL arrays in various configurations (2×8, 2×16, 2×32, or 2×64 may be optimal in some embodiments) wherein the VCSELS in one row are offset from the VCSELs in adjacent other rows. In some embodiments, the VCSEL arrays are placed end to end in a line directly on a board; the pitch is maintained across chip edges to better than 10 microns (10 µm). In some embodiments, alignment marks on the chips and alignment marks on the board allow the chips to be placed so that the VCSEL-to-VCSEL alignment remains constant across chip edges (i.e., across the junction where two chips are placed end-to-end, the spacing between an end VCSEL on one chip and the corresponding adjacent VCSEL in the neighboring chip is substantially the same as the VCSEL-to-VCSEL spacing within a single chip). In some embodiments, the VCSEL chips are either sawn or cleaved in the long direction and then cleaved in the short direction so that they have clean sharp end edges that can be placed close together on the board. In some embodiments, a graded-index-fiber (GRIN) lens array is aligned to the VCSELs to focus the beam. In some embodiments, the GRIN lens array is imaging (forming a focused composite image from all the lenses) so that all light from a given VCSEL is focused to the same spot, regardless of through which lens the light travels. In some embodiments, a matrix-addressing driver scheme allows each VCSEL to be turned on sequentially, in order to scan the location to which the light is directed. In some embodiments, a 100-micron (100-µm) pitch is maintained.

While multiple embodiments are disclosed, still other embodiments of the present disclosure will become apparent to those skilled in the art from the following detailed description, which shows and describes illustrative embodiments of the invention. As will be realized, the various embodiments of the present disclosure are capable of modifications in various obvious aspects, all without departing from the spirit and scope of the present disclosure. Accordingly, the drawings and detailed description are to be regarded as illustrative in nature and not restrictive.

BRIEF DESCRIPTION OF THE DRAWINGS

While the specification concludes with claims particularly pointing out and distinctly claiming the subject matter that is regarded as forming the various embodiments of the present disclosure, it is believed that the invention will be better understood from the following description taken in conjunction with the accompanying Figures, in which:

FIG. 2A is a diagrammatic cross section view of a structure arrangement for a movable-mirror vertical-cavity surface-emitting laser 201.

FIG. 2B is a diagrammatic cross section view of a structure arrangement for a movable-mirror dual-aperture vertical-cavity surface-emitting laser 202.

FIG. 2C is a diagrammatic cross section view of a structure arrangement for a movable-mirror vertical-cavity surface-emitting laser 203.

FIG. 2D is a diagrammatic cross section view of a structure arrangement for a movable-mirror dual-aperture vertical-cavity surface-emitting laser 204.

FIG. 2E is a diagrammatic cross section view of a structure arrangement for a movable mirror vertical-cavity surface-emitting laser 205.

FIG. 2F is a diagrammatic cross section view of a structure arrangement for a movable mirror dual-aperture vertical-cavity surface-emitting laser 206.

FIG. 2H is a diagrammatic cross section view of a structure arrangement for a movable-mirror dual-aperture vertical-cavity surface-emitting laser 207.

FIG. 2*i*-1 is a graph 291 of reflectivity as a function of wavelength for the movable mirror 241 of movable-mirror dual-aperture vertical-cavity surface-emitting laser 207.

FIG. 2J-1 is a graph 292 of reflectivity as a function of wavelength for the fixed mirror 142 of movable-mirror dual-aperture vertical-cavity surface-emitting laser 207.

FIG. 2*i*-2 includes an enlarged graph 291 of reflectivity as a function of wavelength for the movable mirror 241 of movable-mirror dual-aperture vertical-cavity surface-emitting laser 207 and an enlarged graph 292 of reflectivity as a function of wavelength for the fixed mirror 142 of movable-mirror dual-aperture vertical-cavity surface-emitting laser 207.

FIG. 3B is a diagrammatic cross section view of a layered structure arrangement for a part of a wafer 302 for processing into movable-mirror dual-aperture vertical-cavity surface-emitting laser after ion implantation.

FIG. 3C is a diagrammatic cross section view of a layered structure arrangement for a part of a wafer 303 after deposition of top mirror structure 241.

FIG. 3D is a diagrammatic cross section view of a layered structure arrangement for a part of a wafer 304 after trench-etching side wells 342.

FIG. 3E is a diagrammatic cross section view of a layered structure arrangement for a part of a wafer 305 after adding side-well protection 343.

FIG. 3F is a diagrammatic cross section view of a layered structure arrangement for a part of a wafer 306 after adding ohmic contacts 344.

FIG. 3G is a diagrammatic cross section view of a layered structure arrangement for a part of a wafer 307 after releasing membrane 345.

FIG. 4A is a graph 401 having a plurality of curves of reflected light intensity as a function of wavelength for an experimental movable mirror setup (one curve for each of nine different voltages applied to the heating elements).

FIG. 5 is a table of features and advantages of various combinations of the present invention having movable tuning-mirror assemblies.

FIG. 6A is a diagrammatic perspective top view of a structure arrangement for a device 601 made by wafer-scale packaging according to some embodiments of the present invention.

FIG. 6B is a diagrammatic perspective bottom view of device 601 of FIG. 6A according to some embodiments of the present invention.

FIG. 6C is a diagrammatic perspective top view of device 601 of FIG. 6A according to some embodiments of the present invention.

FIG. 6E1 is a diagrammatic cross-section side view of a device 605 having the capability of hermetic sealing, according to some embodiments of the present invention.

FIG. 6E2 is a diagrammatic cross-section side view of a device 6051 having the capability of adjustable wavelength tuning and/or adjustable focusing lenses in addition to or in place of the hermetic sealing of FIG. 6E1, according to some embodiments of the present invention.

FIG. 6F is another diagrammatic perspective bottom view of device 601 of FIG. 6A according to some embodiments of the present invention.

FIG. 6G is photomicrograph bottom view of a device 606 according to some embodiments of the present invention.

FIG. 6H is photomicrograph top view of device 606 of FIG. 6G according to some embodiments of the present invention.

FIG. 7A is an enlarged photomicrograph top view focussed on apertures of device 606 of FIG. 6G according to some embodiments of the present invention.

FIG. 7B is an enlarged photomicrograph top view focussed on the VCSELs of device 606 of FIG. 7A according to some embodiments of the present invention.

FIG. 7C is an enlarged photomicrograph top view focussed on "relay" images of the VCSELs of device 606 of FIG. 7A according to some embodiments of the present invention.

FIG. 7D is a further-enlarged photomicrograph top view of an individual lens of device 606 of FIG. 7A according to some embodiments of the present invention.

FIG. 7E is a scanned-topographical image perspective view of an individual lens of device 606 of FIG. 7A according to some embodiments of the present invention.

FIG. 8 is a table of features and advantages of various combinations of the present invention having wafer-scale packaging.

FIG. 9A is a diagrammatic perspective top view of a structure arrangement for a device 901 using packaging suitable for scanning applications, according to some embodiments of the present invention.

FIG. 9B is a diagrammatic perspective bottom view of a structure arrangement for device 901, according to some embodiments of the present invention.

FIG. 9C is a diagrammatic exploded perspective bottom view of a structure arrangement for device 901, according to some embodiments of the present invention.

FIG. 9D is a diagrammatic enlarged top view of a structure arrangement for device 904 using packaging suitable for scanning applications, according to some embodiments of the present invention.

FIG. 9E is a diagrammatic enlarged top view of a structure arrangement for device 905 using packaging suitable for scanning applications, according to some embodiments of the present invention.

FIG. 10 is a table of features and advantages of various combinations of the present invention, describing aspects of devices and packaging for subsystems suitable for scanning applications and the like.

DETAILED DESCRIPTION

Although the following detailed description contains many specifics for the purpose of illustration, a person of ordinary skill in the art will appreciate that many variations and alterations to the following details are within the scope of the invention. Accordingly, the following embodiments of the invention are set forth without any loss of generality to, and without imposing limitations upon the claimed invention. Further, in the following detailed description of the embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number may be used throughout to refer to an identical component that appears in multiple figures. Signals and connections may be referred to by the same reference number or label, and the actual meaning will be clear from its use in the context of the description.

In some embodiments, the present invention provides VCSELs that emit high-quality (e.g., in some embodiments, single-mode) laser light useful for oximetry, fluorescence spectrometry or spectroscopic sensors. The packaging simplicity and narrow spectral linewidth of VCSELs makes them ideal for these applications, and the approach outlined in this invention can be applied in embodiments that cover all of the same wavelengths and associated materials that standard VCSELs can be fabricated at, and in particular in the range of about 600 nm to about 2000 nm. For example, in some embodiments, devices of the present invention facilitate outputting signal light having wavelengths in the range of 650 nm to 680 nm. Additional VCSEL applications, including printing or bar-code scanning, benefit from single-spatial-mode devices.

Figure 1A:
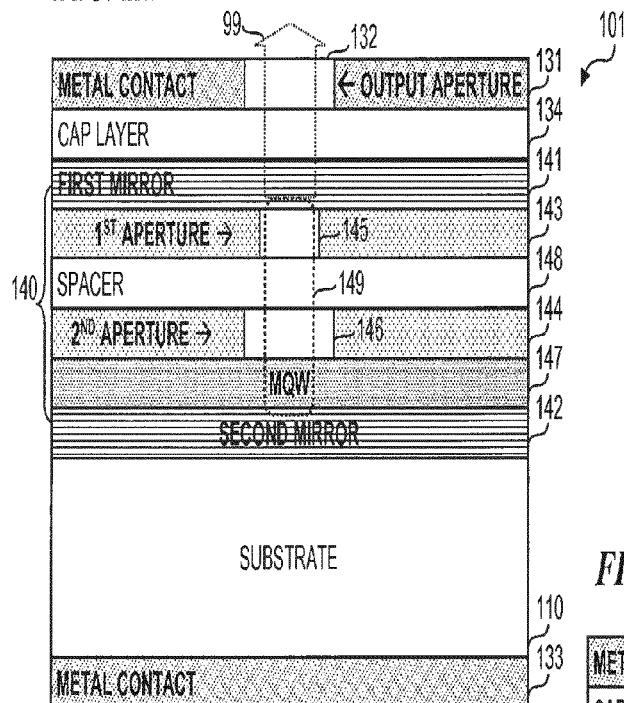
FIG. 1A is a diagrammatic cross section view of a structure arrangement for a dual aperture vertical-cavity surface-emitting laser 101.
Figure 1B:
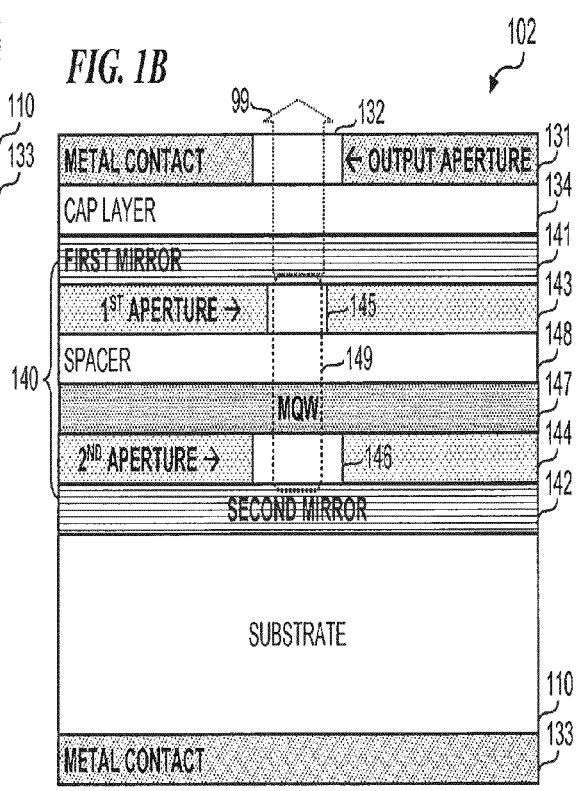
FIG. 1B is a diagrammatic cross section view of a structure arrangement for a dual aperture vertical-cavity surface-emitting laser 102.

In some embodiments, the present invention modifies (by replacing or supplementing the first mirror 141 of FIG. 1B (e.g., the mirror furthest from the substrate 110) with a movable top mirror 241 as shown in FIG. 2A for example) various structures that are described in U.S. Provisional Application No. 61/512,333 filed on Jul. 27, 2011, titled "METHOD AND APPARATUS INCLUDING IMPROVED VERTICAL-CAVITY SURFACE-EMITTING LASERS," and/or the various structures that are described in U.S. patent application Ser. No. 13/163,434, filed Jun. 17, 2011, titled "PUSH-PULL MODULATED COUPLED VERTICAL-CAVITY SURFACE-EMITTING LASERS AND METHOD," which are both incorporated herein by reference.

FIG. 1A (described further in U.S. patent application Ser. No. 13/163,434, filed Jun. 17, 2011, titled "PUSH-PULL MODULATED COUPLED VERTICAL-CAVITY SURFACE-EMITTING LASERS AND METHOD" which is incorporated herein by reference) is a diagrammatic cross section view of a VCSEL device 101 for generating laser emission 99, according to some embodiments of the present invention. In some embodiments, VCSEL device 101 includes a semiconductor substrate 110, a vertical-cavity surface-emitting laser (VCSEL) cavity structure 140 formed on the substrate 110, a first electrical contact 131 formed on the VCSEL structure 140, a second electrical contact 133 formed on the substrate 110 on a face (e.g., this is the bottom side as shown in FIG. 1A) opposite the first electrical contact 131. The device 101 is configured such that electrical current that flows between the first electrical contact 131 and the second electrical contact 133 in order to provide pump energy to the VCSEL cavity structure 140. In some embodiments, the VCSEL 101 includes a resonating cavity 149, the resonating cavity 149 having a first mirror 141 at first end of the resonating cavity 149 and a second mirror 142 at an opposite second end of the resonating cavity 149, wherein at least one of the first mirror 141 and the second mirror 142 partially transmits and partially reflects light incident on that mirror, and wherein the first mirror 141 and the second mirror 142 are each made of a material that is electrically conductive.

In some embodiments, the resonating cavity 149 is formed in a first semiconductor layer structure 140, which includes a first confining layer 143 located between the first mirror 141 and the second mirror 142, wherein the first confining layer 143 has a first aperture 145 that restricts the current to pass primarily through the first aperture 145. The resonating cavity 149 further includes a second confining layer 144 located between the first confining layer 143 and the second mirror 142, wherein the second confining layer 144 has a second aperture 146 that restricts the electrical current to pass primarily through the second aperture 146. In some embodiments, the first aperture 145 and the second aperture 146 are each centered on an optical axis of the resonating cavity 149 of the VCSEL cavity structure 140. In some embodiments, a multiple-quantum-well (MQW) structure 147 (the gain medium) is located between the first mirror 141 and the second mirror 142, wherein the first aperture 145 and second aperture 146 act together to define a path geometry of the electrical current through the MQW structure 147 in order to improve reliability and/or efficiency.

In some embodiments, the various layers of VCSEL device 101, including substrate 110, second mirror 142, MQW structure 147, second confining layer 144, spacer 148, first confining layer 143, first mirror 141 and cap layer 134, are each formed from one or more crystalline materials, wherein each of the one or more crystalline materials has a lattice constant that is substantially similar to the lattice constant of the substrate 110 in order that, when the various layers are epitaxially grown on the substrate 110, the crystal quality of these layers is of sufficient material quality to form a VCSEL device having good optical and electrical characteristics, as well as good reliability and device lifetime. In some embodiments, spacer 148 includes one or more mirror periods. In some embodiments, spacer 148 is thus partially reflective.

In some embodiments, specific features of the layers that form VCSEL device 101, including metal contact 133, substrate 110, second mirror 142, MQW structure 147, second confining layer 144, spacer 148, first confining layer 143, first mirror 141, cap layer 134, and metal contact 131 are as described in U.S. Pat. No. 7,359,421 by Mary K. Brenner, et al. issued Apr. 15, 2008, titled "RED LIGHT LASER," and U.S. Pat. No. RE41,738 by Mary K. Brenner, et al. issued Sep. 21, 2010, titled "RED LIGHT LASER," which are both incorporated herein in their entirety by reference. In some embodiments, the other and additional various layers, features, and methods of fabricating the VCSEL devices described herein are also described in these two patents.

Still referring to FIG. 1A, the lasing cavity 149 is defined by a first mirror 141 and a second mirror 142. In some embodiments, each of the mirrors is formed using a distributed Bragg reflector (DBR) mirror structure that includes alternating layers of material, wherein each layer has a different index of refraction than that of its two adjacent neighbor layers. Typically a first index of refraction is used for each of the even-numbered layers and a second index of refraction, different than the first, is used for each of the odd-numbered layers. The thickness of each layer is, e.g., ¼ wavelength of the optical signal to be reflected (the thickness of a pair of layers (i.e., the combined thickness of an even-numbered layer and an odd-numbered layer) in each mirror is often called a period) such that the size of the period is determined by the desired wavelength of the VCSEL device 101 (i.e., in some embodiments, the free-space wavelength of the signal wavelength is between about 600 nm to about 2000 nm, and in some particular embodiments, VCSEL device 101 outputs light in the one or more of the subranges of about 600 nm to about 640 nm, of about 640 nm to about 700 nm, of about 650 nm to about 680 nm, of about 700 nm to about 750 nm, of about 750 nm to about 800 nm, of about 800 nm to about 850 nm, of about 850 nm to about 900 nm, of about 900 nm to about 950 nm, of about 950 nm to about 1000 nm, of about 1000 nm to about 1050 nm, of about 1050 nm to about 1100 nm, of about 1000 nm to about 1100 nm, of about 1100 nm to about 1200 nm, of about 1200 nm to about 1300 nm, of about 1300 nm to about 1400 nm, of about 1400 nm to about 1500 nm, of about 1500 nm to about 1600 nm, of about 1600 nm to about 1700 nm, of about 1700 nm to about 1800 nm, of about 1800 nm to about 1900 nm, and/or of about 1800 nm to about 2000 nm). In other embodiments, wavelengths in the range of about 200 nm to about 600 nm are used, while in still other embodiments, wavelengths in the range of about 2,000 nm to about 10,000 nm are used.

In some embodiments, each individual layer has an optical thickness corresponding to one quarter of an optical wavelength ($\lambda/4$), in the material of interest for that layer, for the light intended to be emitted by the VCSEL and a period has an even-numbered layer and an odd-numbered layer each having an optical thickness corresponding to one quarter of an optical wavelength in that material. The optical thickness of each layer is defined by the wavelength of the signal in a vacuum divided by the refractive index of the layer.

For instance, if the wavelength of laser-emission 99 is to be 670 nm, and the layer material composition has a refractive index of about 3.5, then the optical thickness corresponding to one wavelength in the material would be (670 nm)/3.5=191.4 nm. Within each mirror 141 and 142, each of the layers is one-quarter wavelength thick, and so each of the mirror layers would be approximately 48 nm thick (wherein these alternating layers have different thicknesses and different material compositions such that each layer has the same quarter-wavelength optical thickness for the wavelength of interest). Thus, each period includes a quarter-wavelength optical thickness of a first material composition and a quarter-wavelength optical thickness of a different material. Many periods (e.g., in some embodiments, twenty (20) or more periods) of alternating quarter-wavelength-thick pairs of layers of these two materials forms a highly reflective mirror at the intended emission wavelength. In some embodiments, all of the layers of one of the mirrors 141 or 142 are doped to be of n-type conductivity, and the layers of the opposite mirror 142 or 141 are doped to be of p-type conductivity. In some embodiments, the output side of the mirror used for light output (e.g., mirror 141 in FIG. 1A) is coated with a highly doped doping-grading layer (not shown) having a thickness of $n\lambda/2$ wherein n is an integer.

In some embodiments, the alternating layers of material in each of the mirrors 141 and 142 include two differing compositions of $Al_xGa_{1-x}As$, for example, in some embodiments, the mirrors 141 and 142 forming the optical resonance cavity are each constructed from AlGaAs materials having different indexes of refraction. For example, in some embodiments, even-numbered thin-film layers having relatively large index of refraction, due to a composition of approximately $Al_{0.5}Ga_{0.5}As$, where the mole fraction of Al is equal to the mole fraction of Ga, are alternated with odd-numbered thin-film layers having a relatively small index of refraction due to a composition of $Al_xGa_{1-x}As$, where the mole fraction x is greater than about 0.85. In other embodiments, even-numbered thin-film layers are formed from AlAs (i.e., x=1) and odd-numbered thin-film layers are formed from $Al_{0.5}Ga_{0.5}As$ (i.e., x=0.5). A person skilled in the art recognizes that the characterization of "even" and "odd" numbered layers used to designate that every other layer (one layer of each pair of layers) has one composition, while the other layers have the other composition. In other embodiments, the designer may choose to use more than two different compositions, while depositing the different layers in thicknesses that provide the desired thickness taking into account the index of refraction of the given composition and the wavelength of the signal light. In embodiments using just two compositions, other elements may be substituted (e.g., substituting, for example, for certain VCSEL signal wavelengths, two compositions that include indium and phosphorus (for example, InP, and/or two or more compositions of $Ga_xIn_{1-x}P$ or other suitable compositions that function to have different indices of refraction based on the mole fraction specified by X, and/or that provide electrical conductivity to the active region) may be used.

In some embodiments, in addition to the wavelength-defining alternating layers of differing indexes of refraction, the first and/or second mirror further include a much thinner graded spacer layer located between at least some of the adjacent alternating layers and formed such that the aluminum and gallium distributions of the spacer layers are monotonically mole-fraction graded over the spacer-layer thickness to match the gallium content in the primary quarter-wave layers on either side of the graded spacer layers. In some such embodiments, one or both of the mirrors include graded spacer layers in combination with each adjacent quarter-wave layers, wherein each spacer layer has a thickness of about 1 nm and the total thickness of the each period is still $\lambda/2$ (i.e., as the thickness of the graded layer increases, the adjacent "quarter-wave" layers decrease to less than $\lambda/4$ in order to keep the total thickness of each period $\lambda/2$). In other embodiments, the spacer layers are between about 1 mm and about 2 nm, or between about 2 nm and about 3 mm, or between about 3 nm and about 4 nm, or between about 4 nm and about 5 nm, or between about 5 nm and about 10 nm, or greater than about 10 nm. In some embodiments, the spacer layers are as described in U.S. Pat. No. RE41,738 by Mary K. Brenner, et al. issued Sep. 21, 2010, titled "RED LIGHT LASER," which is incorporated herein by reference.

Still referring to FIG. 1A, in some embodiments, VCSEL device 101 includes a plurality of apertures, including a first intracavity aperture 145 and a second intracavity aperture 146. In some embodiments, the device also includes an output aperture 132 formed within one or both of the electrical contact layers (e.g., in the embodiment shown this is in layer 131; in other embodiments, this aperture is formed in the metal 133 of the opposite face or in both faces.). In some embodiments, the first intracavity aperture 145 has a size that is less than the size of the second intracavity aperture 146, such that the first intracavity aperture 145 provides a relatively weak index-of-refraction guide that confines the transverse optical modes of the cavity (in some embodiments, layer 143 is an oxide that is electrically insulating, which also forces the electrons and/or holes through aperture 145) and the second aperture 146 provides charge-carrier confinement to direct the holes and electrons to a center portion of the MQW structure 147 active region, where, in some embodiments, the charge-confinement aperture 146 is larger than index-guide aperture 145. In some embodiments, the first intracavity aperture 145 is spaced at a non-zero distance from the MQW structure 147, either above or below. That is, in some embodiments, the transverse-mode-confining layer 145 is spaced between approximately four (4) periods and approximately twelve (12) periods (i.e., two to six times the laser-light wavelength in the material within the aperture) from the active layer. In some embodiments, the second intracavity aperture 146 is located a distance from the MQW structure 147, either above or below, that is between approximately zero (0) periods and approximately four (4) periods, wherein (as described above) the thickness of the period is designed to be reflective at the desired wavelength of VCSEL device 101 (i.e., in some embodiments, the desired wavelength of the VCSEL is between about 640 nm to about 700 nm, while in other embodiments, wavelengths in the range of 200 nm to about 2000 nm or one or more subranges thereof, as listed above). The wavelength at which the layers in the DBR mirrors are reflective determines the lasing wavelength of device 101. In some embodiments, the first intracavity aperture 145 and the second intracavity aperture 146 are each formed from an oxide (e.g., from an aluminum-containing layer that has been wet-oxidized from the sides), or are each formed via proton implantation. In other embodiments, only one of the apertures is formed from an oxide, and the other aperture is formed via proton implantation. In other embodiments, any other suitable method (such as, e.g., ionized helium implantation or lithographic masking) for forming the aperture is specifically contemplated.

As described for the various embodiments shown herein, the first intracavity aperture 145 and the second intracavity aperture 146 are located either both on one side of the MQW structure 147, or one of the intracavity apertures is located on one side of the MQW structure 147 and the other intracavity aperture is located on the opposite side the MQW structure 147.

FIG. 1B (also described further in U.S. patent application Ser. No. 13/163,434, filed Jun. 17, 2011, titled "PUSH-PULL MODULATED COUPLED VERTICAL-CAVITY SURFACE-EMITTING LASERS AND METHOD" which is incorporated herein by reference) is a diagrammatic cross section view of a VCSEL device 102 for generating laser emission 99, according to some embodiments of the present invention. VCSEL device 102 is similar to VCSEL device 101, except that the second aperture 144 has been deposited first (before the multiple-quantum-well layers 147) such that it is under the MQW 147 rather than over the MQW 147 as in device 101 shown in FIG. 1A.

FIG. 2A is a diagrammatic cross section view of a structure arrangement for a movable-mirror vertical-cavity surface-emitting laser 201 for generating laser emission 99, according to some embodiments of the present invention. In some embodiments, the various layers of VCSEL device 201, including substrate 110, second mirror 142, MQW structure 147, cap layer 134, and top metal contact 131 are substantially the same as the corresponding various layers of VCSEL device 101 described above for FIG. 1A. In addition, VCSEL device 201 includes an insulator layer 233 (which, in some embodiments, includes an opening or aperture about the same size and location as the aperture 132 in top metal contact 131 as shown in FIG. 2A, while in other embodiments, the insulator layer 233 is transparent and no aperture is needed), a membrane having one or more layers of materials such as AlGaAs 249 and/or NiCr (nichrome) 251 that expand or contract when heated or cooled, metal contacts 258 and 259 which provide electrical signals to the motion mechanism (e.g., in the embodiment shown to the NiCr layer 251), and the first mirror 241 which can be controllably moved to tune the wavelength of the VCSEL. In other embodiments, other motion-inducing materials and mechanisms (such as piezo materials (such as described in U.S. Pat. No. 7,719,693 titled "Interferometry system chamber viewing window" which issued May 18, 2010, and which is incorporated herein by reference), magnetics (such as described in U.S. Pat. No. 7,557,470 titled "6-axis electromagnetically-actuated meso-scale nanopositioner" which issued Jul. 7, 2009, and which is incorporated herein by reference), capacitive or electrostatic plates (such as described in U.S. Pat. No. 6,665,109 titled "Compliant mechanism and method of forming same" which issued Dec. 16, 2003, and which is incorporated herein by reference), hydraulics or pneumatics (such as described in U.S. Pat. No. 8,002,933 titled "Microfabricated elastomeric valve and pump systems" which issued Aug. 23, 2011, and which is incorporated herein by reference), or other micro-electrical-mechanical systems (MEMS) technologies or combinations thereof) are used to move the first mirror 241, replacing the expandable adjustable membrane 250 and its thermal-expansion materials 251 and flexible support materials 249.

FIG. 2B is a diagrammatic cross section view of a structure arrangement for a movable-mirror dual-aperture vertical-cavity surface-emitting laser 202, according to some embodiments of the present invention. In some embodiments, the first electrical contact 131 is formed on the VCSEL cavity structure 140, the second electrical contact 133 is formed on the substrate 110 on a face (e.g., this is the bottom side as shown in FIG. 2B) opposite the first electrical contact 131. The device 202 is configured such that electrical current that flows between the first electrical contact 131 and the second electrical contact 133 in order to provide pump energy to the VCSEL cavity structure 140. In some embodiments, the VCSEL 202 includes a resonating cavity 149, the resonating cavity 149 having a movable first mirror 241 at a first end of the resonating cavity 149 and a second mirror 142 at an opposite second end of the resonating cavity 149, wherein at least one of the movable first mirror 241 and the second mirror 142 partially transmits and partially reflects light incident on that mirror, and wherein at least the second mirror 142 is made of a material that is electrically conductive. In other embodiments, however, the second mirror 142 need not be made of a material that is electrically conductive. A current spreading layer may be provided between the second mirror 142 and the MQW 147, to which a metal contact may be deposited and patterned on during processing with an etching process.

In some embodiments, the resonating cavity 149 is partially in air between cap layer 134 and the movable first mirror 241, and is partially in the VCSEL cavity structure 140, which includes a cap layer 134, a first confining layer 143 located between the first mirror 141 and the second mirror 142, wherein the first confining layer 143 has a first aperture 145 and restricts the current to pass primarily through the first aperture 145 and that also restricts the laser light to this aperture. In some embodiments, the resonating cavity 149 further includes a second confining layer 144 located between the first confining layer 143 and the second mirror 142, wherein the second confining layer 144 has a second aperture 146 that restricts the electrical current to pass primarily through the second aperture 146. In some embodiments, the first aperture 145 and the second aperture 146 are each centered on an optical axis of the VCSEL cavity structure 140 of device 202.

In the embodiment shown in FIG. 2B, the NiCr layer 251 and semiconductor layer 249 extend across substantially the entire bottom surface of first mirror 241, but the NiCr layer has an opening therethrough (not shown in this cross section) so that laser-signal light of the lasing wavelength passes through the opening or aperture (not shown) in the metal 251 and through semiconductor layer 249 to then partially reflect from, and partially transmit through, first mirror 241. In contrast to the embodiment shown in FIG. 2B, other embodiments form an opening in both the metal and semiconductor layers 251 and 249 under the top mirror 241 (similar to embodiments such as shown in FIG. 2D) for the light 99 to pass through. In some embodiments, most or all other aspects are as described above for FIG. 1B.

FIG. 2C is a diagrammatic cross section view of a structure arrangement for a movable-mirror vertical-cavity surface-emitting laser 203. In some embodiments, device 203 is substantially identical to device 201 of FIG. 2A, except that the thermally movable arms 252 supporting the first mirror 241 are entirely made of a resistive metal such as a nichrome alloy (NiCr).

Figure 2G:
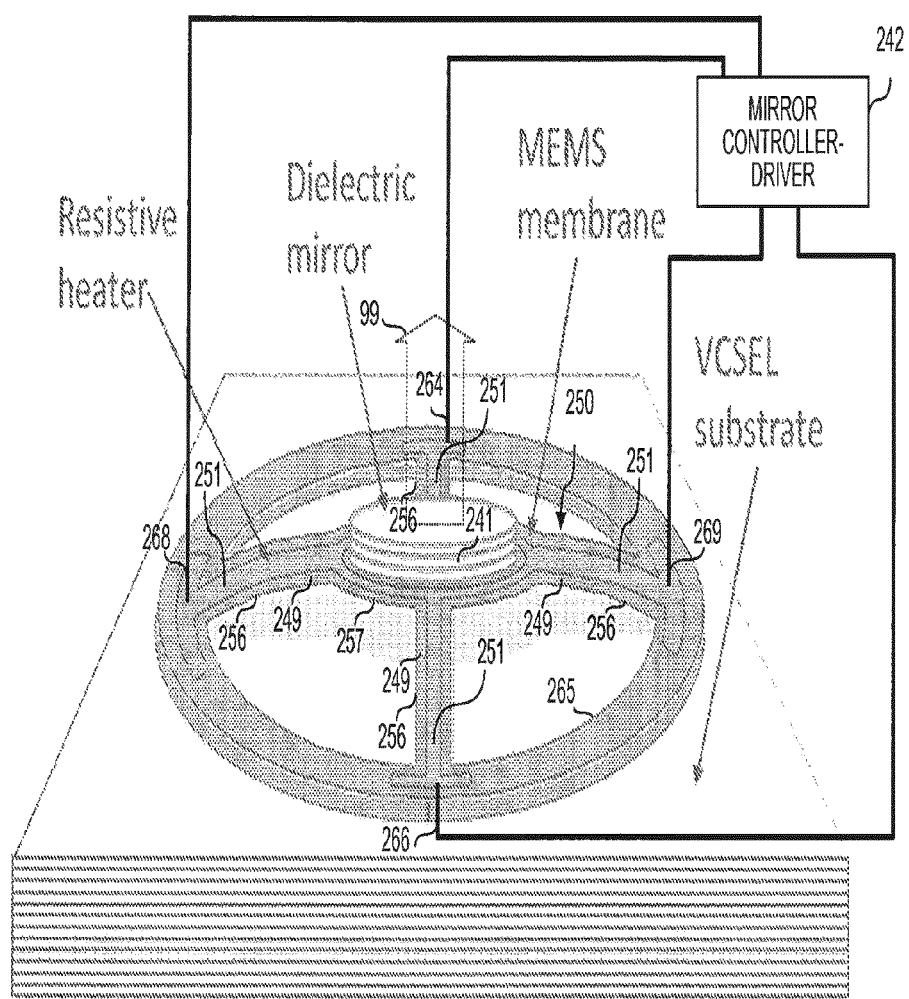
FIG. 2G is a diagrammatic perspective top view of a structure arrangement for a movable-mirror vertical-cavity surface-emitting laser 281 such as any of the devices 201-209 shown in FIGS. 2A-2F, 2H and 2K-2L.

FIG. 2D is a diagrammatic cross section view of a structure arrangement for a movable-mirror dual-aperture vertical-cavity surface-emitting laser 204. In some embodiments, device 204 is substantially identical to device 202 of FIG. 2B, except that the thermally movable arms 252 supporting the first mirror 241 are entirely made of a resistive metal such as a nichrome alloy (NiCr). Also shown in FIG. 2D are signal source 271 used to provide electrical power to drive the laser's light output signal 99 and signal source 272 used to provide electrical power to deform the nichrome arms 252 thus moving the first mirror 241 to wavelength-tune the laser's light output signal 99. In every example embodiment shown herein (e.g., FIGS. 2A-2H, 2K-2M, 3G, 5, 6E) corresponding signal sources are used to drive the light output and tuning of the respective embodiments.

FIG. 2E is a diagrammatic cross section view of a structure arrangement for a movable-mirror vertical-cavity surface-emitting laser 205. This embodiment is substantially the same as VCSEL 202 of FIG. 2B, except that VCSEL 205 has the second aperture 146 on the opposite side of MQW 147 relative to the first aperture 145, and an opening has been formed through semiconductor layer 249 and NiCr layer 252 for the light of the resonating cavity 149 and the output light 99 to pass through.

FIG. 2F is a diagrammatic cross section view of a structure arrangement for a movable-mirror dual-aperture vertical-cavity surface-emitting laser 206. This embodiment is substantially the same as VCSEL 204 of FIG. 2D, except that VCSEL 205 has the second aperture 146 on the opposite side of MQW 147 relative to the first aperture 145, and no opening has been formed through NiCr layer 252, but the layer 252 is made or etched thin enough (at least across a suitable light-exit aperture area) for the light of the resonating cavity 149 and the output light 99 to pass through.

In other embodiments, modifications to the embodiments shown in FIGS. 2A-2F are used, wherein the movable first mirror 241 is made highly reflective and the fixed second mirror 142 is made partially reflective, and optionally an opening is made through the laser's bottom metal contact 133 along the propagation axis of the lasing light 149 such that the output light exits through the opening in the metal-contact layer 133 at the bottom of the chip. In still other embodiments, both the movable first mirror 241 and the fixed second mirror 142 are made partially reflective, such that output laser light exits both the top and bottom of the chip.

FIG. 2G is a diagrammatic perspective top view of a structure arrangement for a movable-mirror vertical-cavity surface-emitting laser 281 such as any of the devices 201-209 shown in FIGS. 2A-2F, 2H AND 2K-2L. In some embodiments, VCSEL 281 includes four arms each having a semiconductor-material layer 249 on top of which a resistive thermal-expansion (e.g., NiCr) stripe layer 251 is formed. The four arms 256 connect from a peripheral ring 265 to a movable central platform 257 on which the first mirror 241 is formed. Four electrical contacts 264, 266, 268 and 269 provide electrical signals from the mirror-controller heater-drive circuit 242 to the resistive heater stripes 251. In other embodiments, other numbers of arms (other than the four shown in this Figure) may be used.

FIG. 2H is a diagrammatic cross section view of a structure arrangement for a movable-mirror dual-aperture vertical-cavity surface-emitting laser 207. This diagram shows that the optical distance between the first mirror 241 and the second mirror 142 can be adjusted under electrical-signal control from a first distance L1 (where the first mirror 241 is closest to the gain medium 147 and second mirror 142 on the far side of the gain medium 147) to a second distance L2 (where the first mirror 241 is farthest to the gain medium 147 and second mirror 142 on the far side of the gain medium 147). In some embodiments, the first mirror 241 has a reflectivity as a function of wavelength as depicted by graph 291 of FIG. 2*i*-1, while the second mirror 142 has a reflectivity as a function of wavelength as depicted by graph 292 of FIG. 2J-1. FIG. 2*i*-2 includes an enlarged graph 291 of reflectivity as a function of wavelength for the movable mirror 241 of movable-mirror dual-aperture vertical-cavity surface-emitting laser 207 and an enlarged graph 292 of reflectivity as a function of wavelength for the fixed mirror 142 of movable-mirror dual-aperture vertical-cavity surface-emitting laser 207.

Figure 2K:
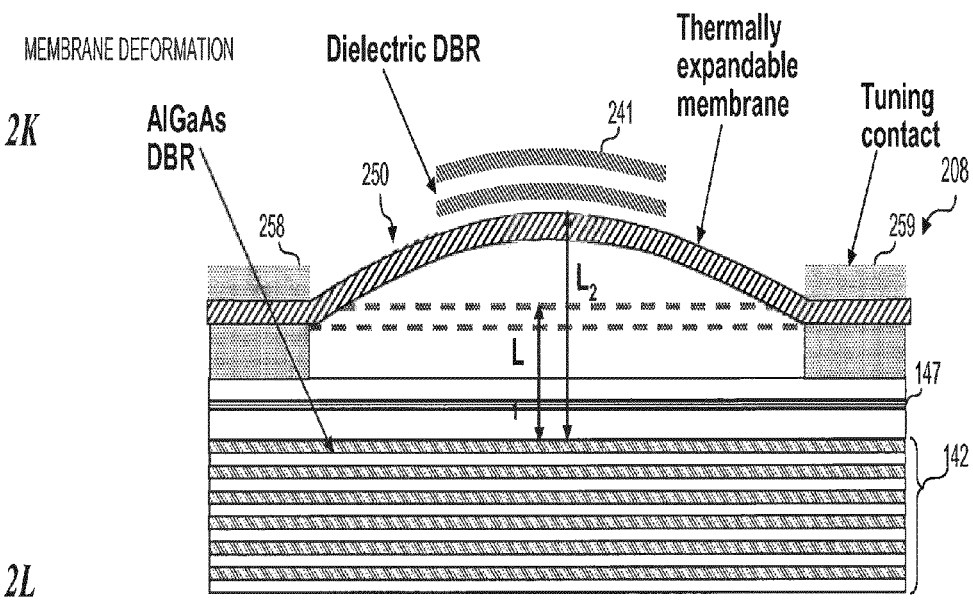
FIG. 2K is a diagrammatic cross section view of a structure arrangement for a movable-mirror dual-aperture vertical-cavity surface-emitting laser 208.

FIG. 2K is another diagrammatic cross section view of a structure arrangement for a movable-mirror dual-aperture vertical-cavity surface-emitting laser 208. This diagram again shows that the optical distance between the first mirror 241 and the second mirror 142 can be adjusted under electrical-signal control from a first distance L1 (where the first mirror 241 is closest to the gain medium 147 and second mirror 142 on the far side of the gain medium 147) to a second distance L2 (where the first mirror 241 is farthest to the gain medium 147 and second mirror 142 on the far side of the gain medium 147).

Figure 2L:
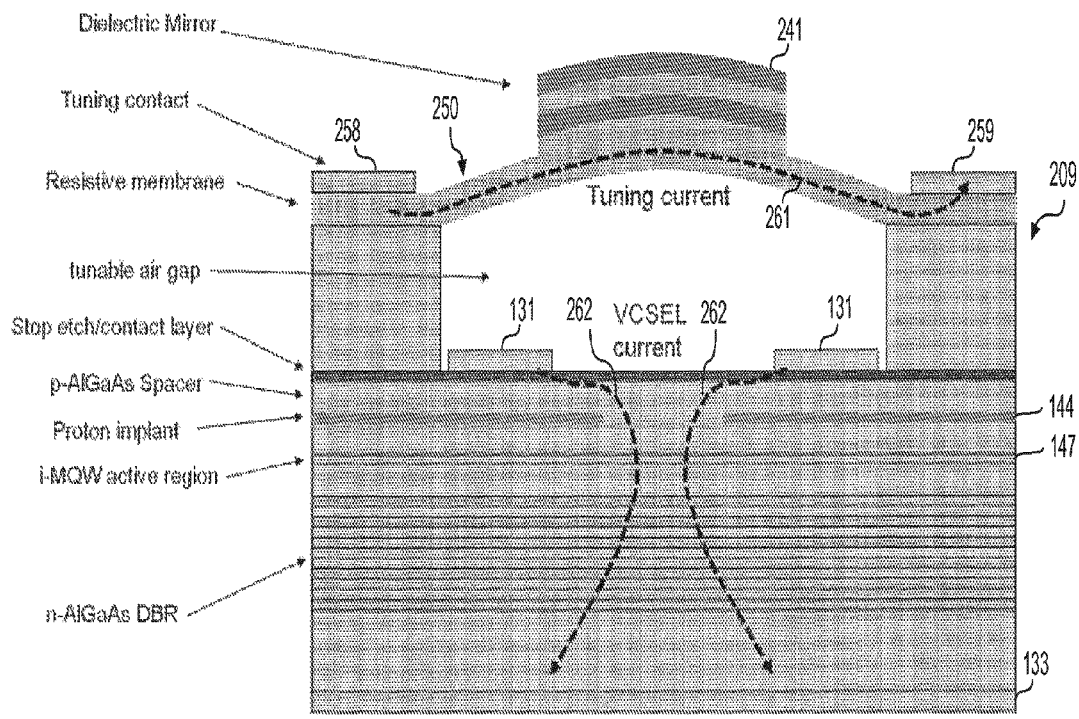
FIG. 2L is a diagrammatic cross section view of a structure arrangement for a movable mirror dual-aperture vertical-cavity surface-emitting laser 209.

FIG. 2L is a diagrammatic cross section view of a structure arrangement for a movable-mirror dual-aperture vertical-cavity surface-emitting laser 209. This diagram depicts a tuning current 261 flowing between contact 258 and contact 259, which controls the amount of deformation, and a VCSEL excitation current 262 flowing between contact 131 and contact 133, which controls the energy going into lasing of the VCSEL.

Figure 2M:
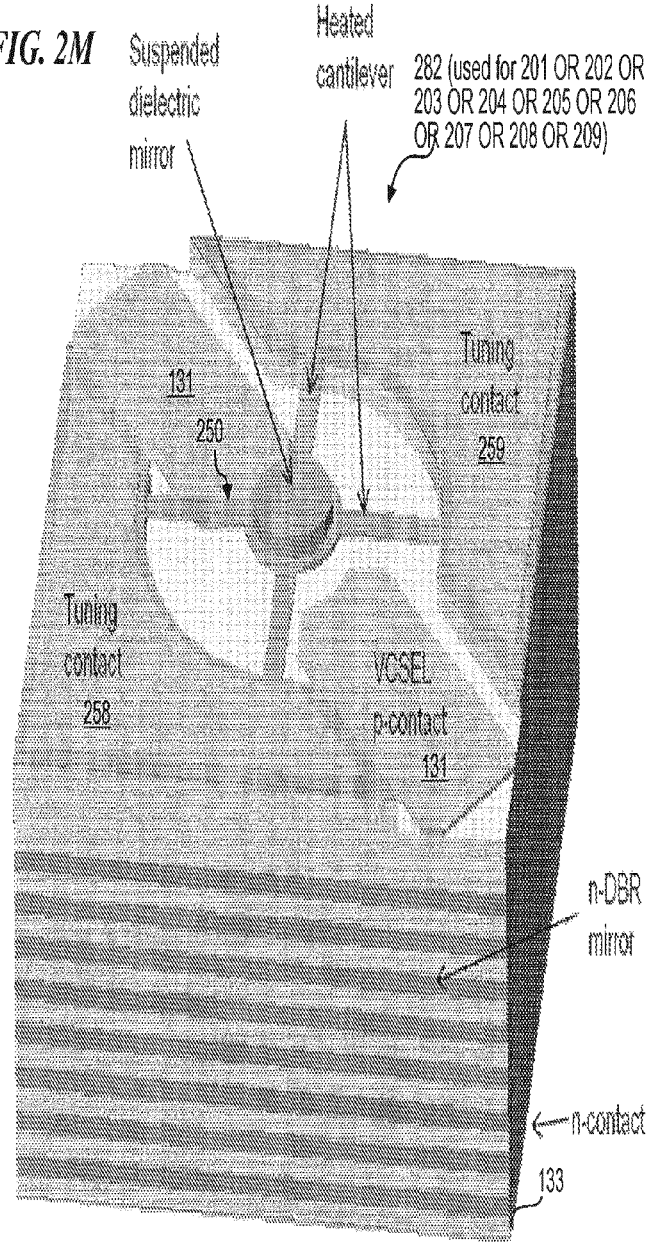
FIG. 2M is a diagrammatic perspective top view of a structure arrangement for a movable-mirror vertical-cavity surface-emitting laser 282 such as any of the devices 201-209 shown in FIGS. 2A-2F, 2H and 2K-2L.

FIG. 2M is a diagrammatic perspective top view of a structure arrangement for a movable-mirror vertical-cavity surface-emitting laser 282 such as any of the devices 201-209 shown in FIGS. 2A-2F, 2H AND 2K-2L. This diagram shows enlarged electrical contact pads 258 and 259 for delivering tuning current 261 and enlarged electrical contact pads 131 for delivering VCSEL-driving current 262. In some embodiments, a thick sacrificial layer is deposited, followed by a thinner semiconductor layer; the first dielectric mirror is deposited and patterned so that it sits directly on top of the last semiconductor layer; a CrNi layer is deposited and patterned on the arms, also on top of the semiconductor, but it is patterned or otherwise configured so it is not under the mirror; and the thick sacrificial layer is then etched away to release the top mirror from the rest of the VCSEL structure and substrate.

Figure 3A:
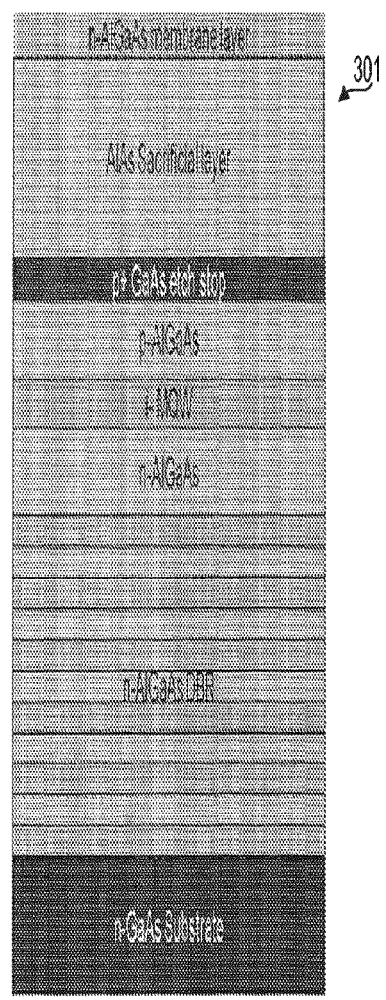
FIG. 3A is a diagrammatic cross section view of a layered structure arrangement for a part of a wafer 301 for processing into movable-mirror dual-aperture vertical-cavity surface-emitting laser.

FIG. 3A is a diagrammatic cross section view of a layered structure arrangement for a wafer 301 for processing into movable-mirror dual-aperture vertical-cavity surface-emitting laser. Onto an n-type GaAs substrate, a plurality of mirror-pair layers of n-type AlGaAs diffractive-Bragg-reflector (DBR) for the second mirror 142 are epitaxially grown, then an n-type AlGaAs spacer layer is epitaxially grown, a plurality of multiple-quantum-well layers are formed, then a p-type AlGaAs spacer layer is epitaxially grown, then a $p^+$-type GaAs etch-stop layer is deposited, then an AlAs sacrificial support layer and then an n-type AlGaAs membrane layer.

The sacrificial layer composition is such that it can be selectively etched laterally to release the suspended membrane, i.e., the composition may be chosen so that an etch will remove that composition, but not etch surrounding material in the membrane or the top layer of the underlying VCSEL. While the $p^+$ GaAs layer in FIG. 3A is labeled as an etch stop layer, it can also serve as an ohmic contact layer for the VCSEL. A different etch stop layer, for example InGaP, could be added between the $p^+$ GaAs layer and the AlAs sacrificial layer. Several alternatives exist for the combination of sacrificial layer and the membrane and top layer/etch stop layer of the VCSEL. Although not limited to those listed, Table 1 contains some of the possibilities:

TABLE 1

| Sacrificial layer | Membrane and top layer of VCSEL |
| --- | --- |
| >90% AlGaAs (or AlAs) | <45% AlGaAs (or GaAs) |
| >90% AlGaAs (or AlAs) | <45% InAlGaAs (<10% InAs) |
| GaAs | >45% AlGaAs (or AlAs) |
| GaAs | InGaP/InAlGaP |

In further embodiments, the membrane could be doped n-type to serve as the resistive heating element requiring no separate metal to form the heater. The membrane layer could also be multiple layers, for instance but not limited to, including a low bandgap top layer, such as GaAs for an ohmic contact, on top of 25% AlGaAs. If a low bandgap material is included to facilitate ohmic contacts, then it can be etched away in the optical path to keep absorption low.

In some embodiments, the sacrificial layer could be doped p-type, or with only a low unintentional background doping, to create electrical isolation between the membrane layer and the rest of the VCSEL.

In still further embodiments, optional upward curvature may be added to the mirror. This could be done by incorporating compressive stress into the membrane layer. Approaches for doing this include, but are not limited to, making the membrane layer with InGaP or InAlGaAs where the lattice constant is larger than the underlying GaAs and AlGaAs layers. The stress can be graded by increasing the In content with the In content less on the side of the layer closest to the sacrificial layer and larger closest to the top surface. This would cause the mirror to preferentially bow upward rather than downward once the sacrificial layer is removed and the membrane layer is released. One could also add another layer to the top of the membrane layer that is compressively stressed. This could include an NiCr resistor layer, a SiN passivation layer, or a dielectric mirror stack.

Figure 11:
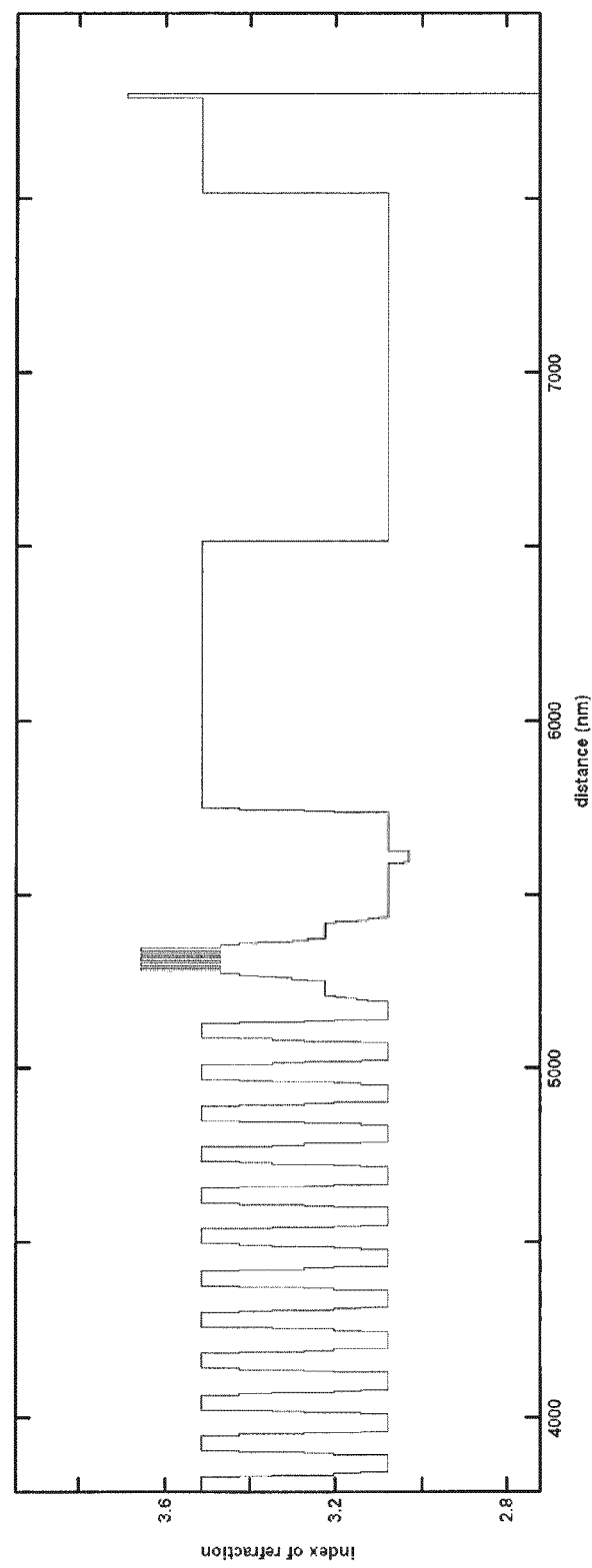
FIG. 11 is a plot of the refractive index of an embodiment incorporating the sacrificial layer into the epitaxial structure as one moves through the epitaxial structure from bottom (left side) to top (right side).

FIG. 11 is a plot of the refractive index of an embodiment incorporating the sacrificial layer into the epitaxial structure as one moves through the epitaxial structure from bottom (left side) to top (right side). In the AlGaAs materials system, a low index corresponds to a high Al content (AlAs), while a high index corresponds to a low Al content (GaAs). Working from bottom to top—the figure shows only a part of the mirror or DBR (distributed Bragg reflector), i.e., around 11 periods. This is followed by an AlGaAs confining layer, an MQW (multi-quantum-well) active region, and another AlGaAs confining layer. In the case where an oxide layer is used to confine the current, a very high Al content layer may be incorporated into the upper confining layer. In this figure, the $p^+$ etch stop of FIG. 3A is replaced by a VCSEL contact/current spreading layer, as described above. In the figure, this is illustrated as a single layer of low Al content, for instance, 5-20% Al content for a device emitting at 850 nm. The composition may desirably be chosen to be as low in Al as possible, but with a bandgap energy higher than the emission wavelength. If an ion implant is used to provide current confinement, then the thickness of this layer should be greater than the depth of the ion implant distribution. The thickness indicated in the figure is approximately 750 nm. This current spreading layer could also consist of 2-3 separate layers. Starting from the bottom, the first could be a thick current spreading layer, followed by a thin (<25 mm) $p^{++}$-contact layer that would be placed at a null of the optical field. Optionally, a third layer could be added as an etch stop. For instance, the etch stop could be InGaP, as described previously.

Figure 12:
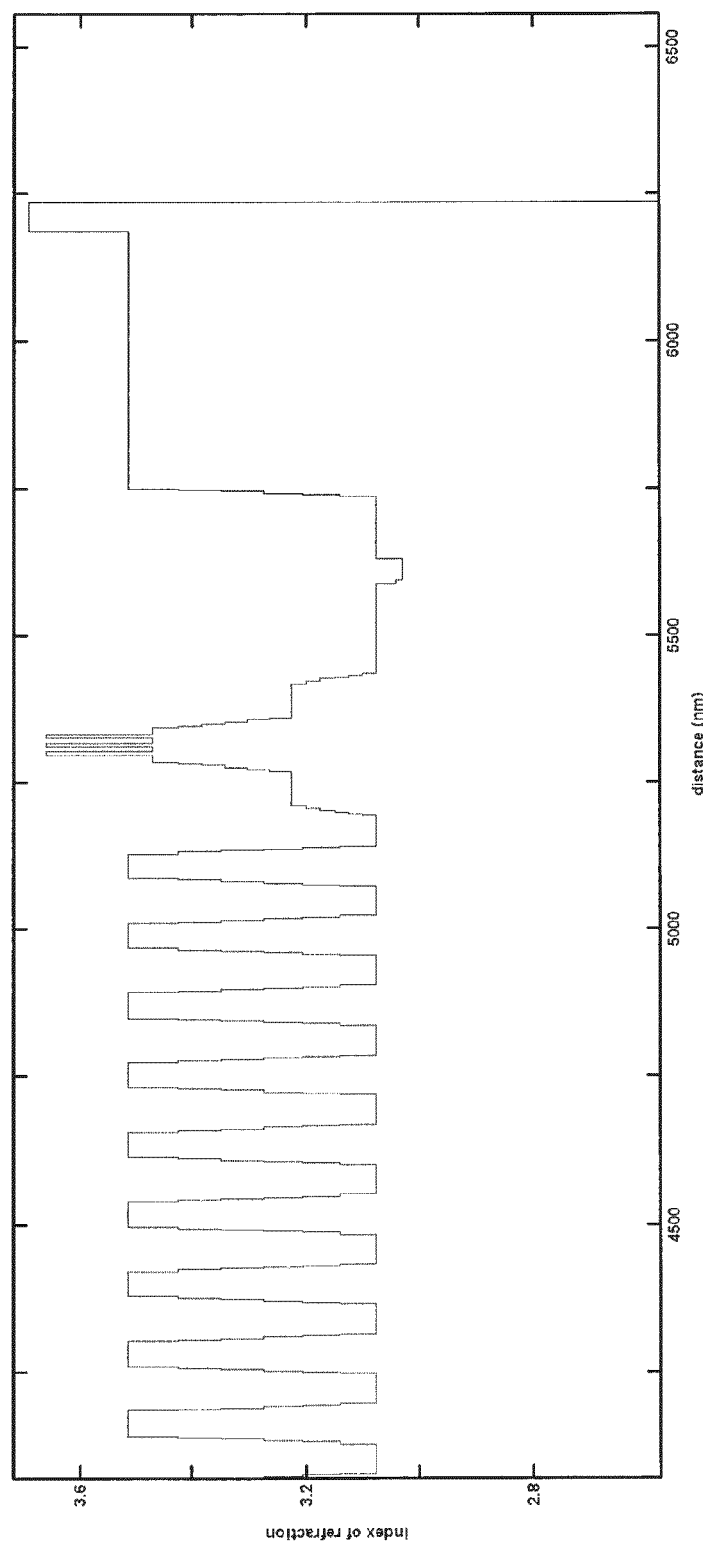
FIG. 12 is a plot of the refractive index of an alternative structure in which the sacrificial layer and membrane are not included in the semiconductor epitaxial structure, but are added later in the fabrication process. The figure shows the refractive index profile of the epitaxial structure starting from partway through the bottom mirror (left) to the top of the structure (right).
Figure 13:
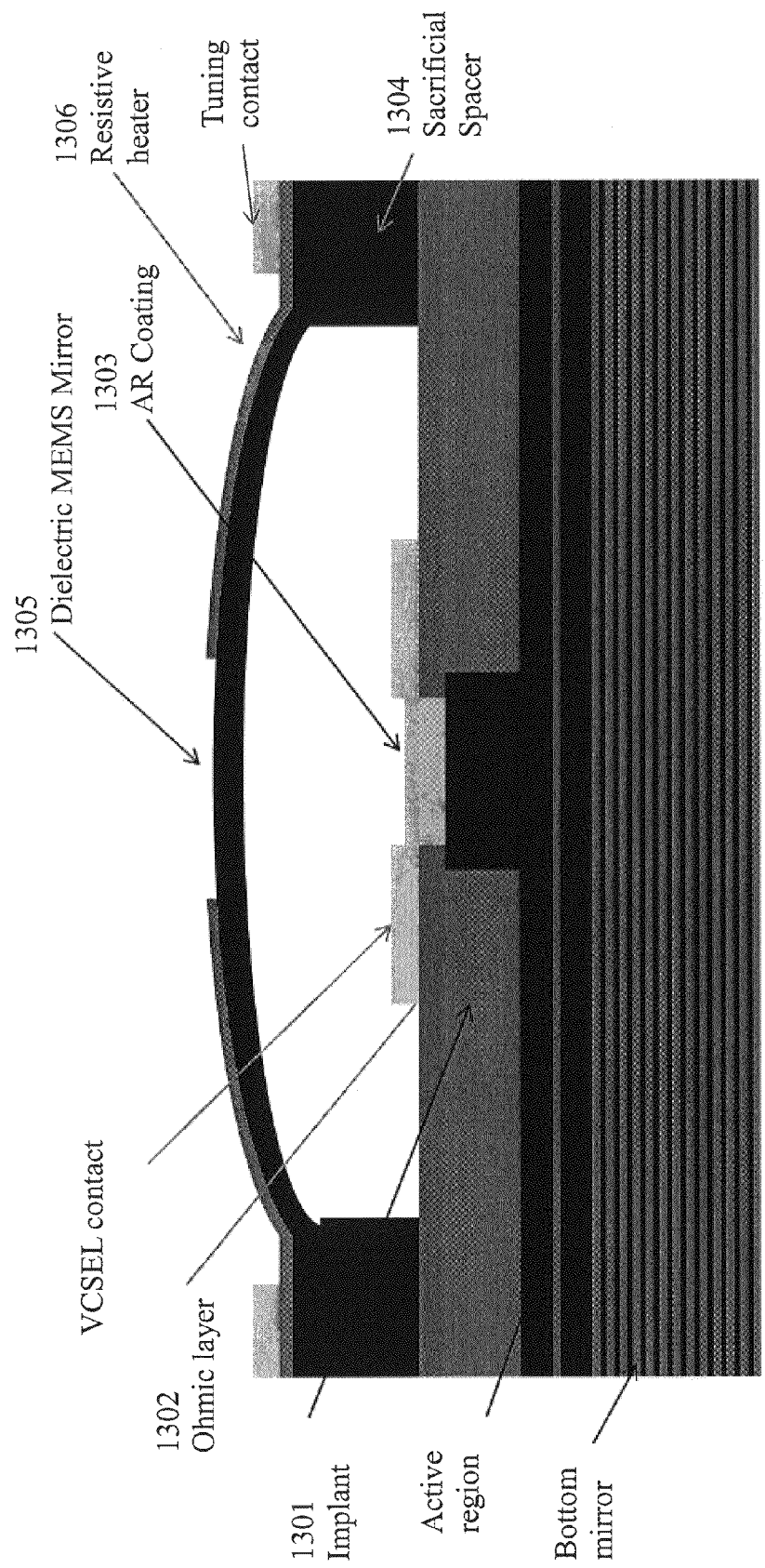
FIG. 13 is a diagrammatic cross section view of a structure arrangement for a movable-mirror dual aperture vertical-cavity surface-emitting laser according to one embodiment.
Figure 14:
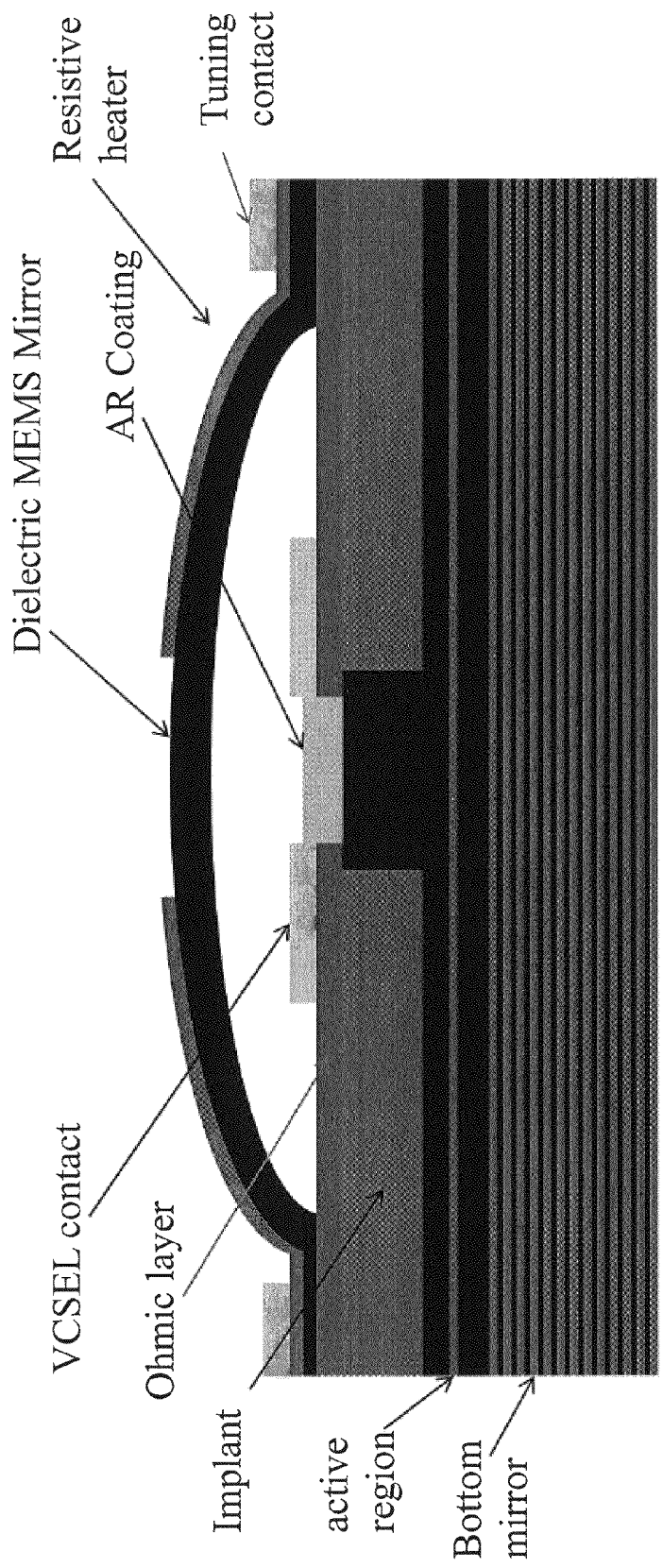
FIG. 14 is a diagrammatic cross section view of a structure arrangement for a movable-mirror dual aperture vertical-cavity surface-emitting laser according to another embodiment.
Figure 15:
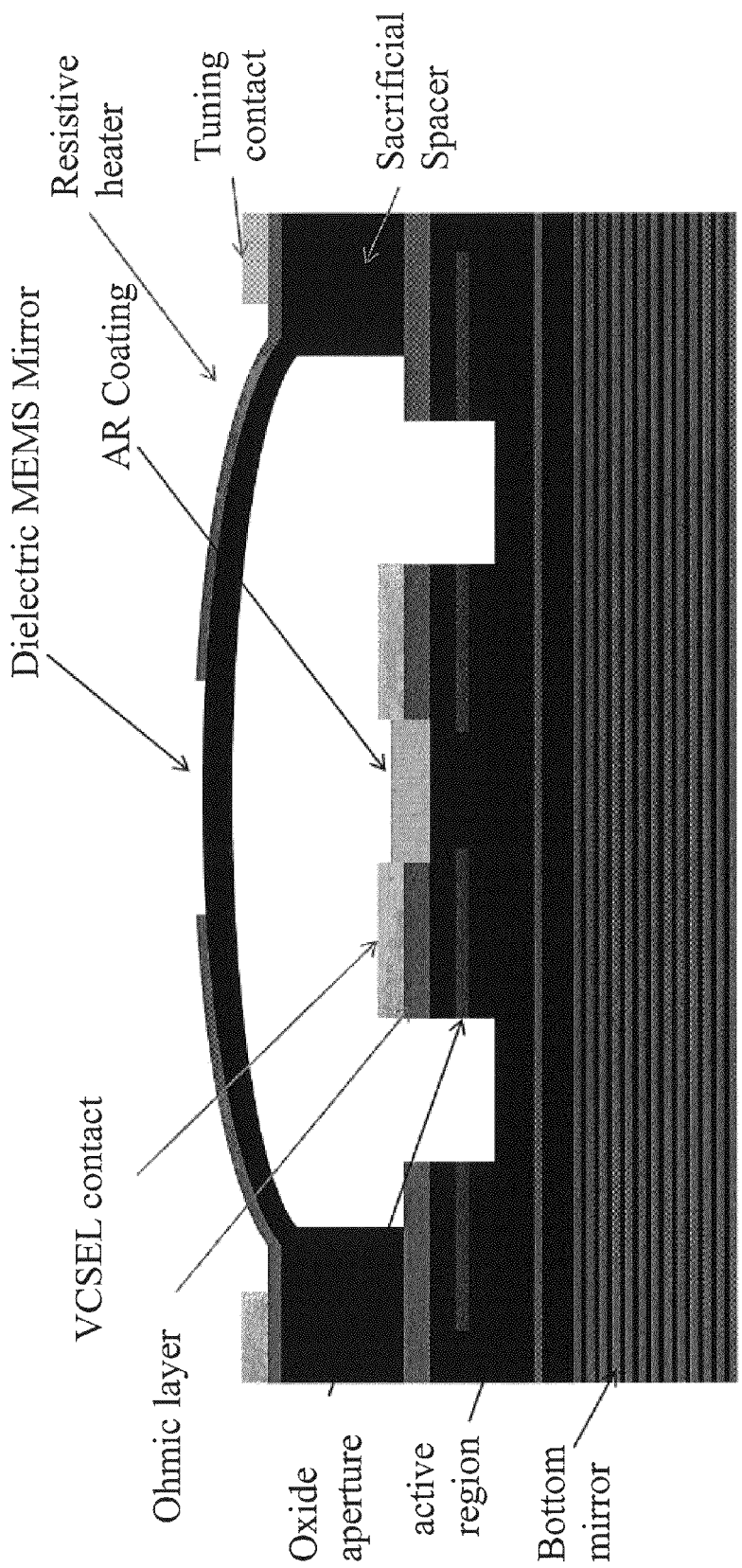
FIG. 15 is a diagrammatic cross section view of a structure arrangement for a movable-mirror dual aperture vertical-cavity surface-emitting laser according to a further embodiment.
Figure 16:
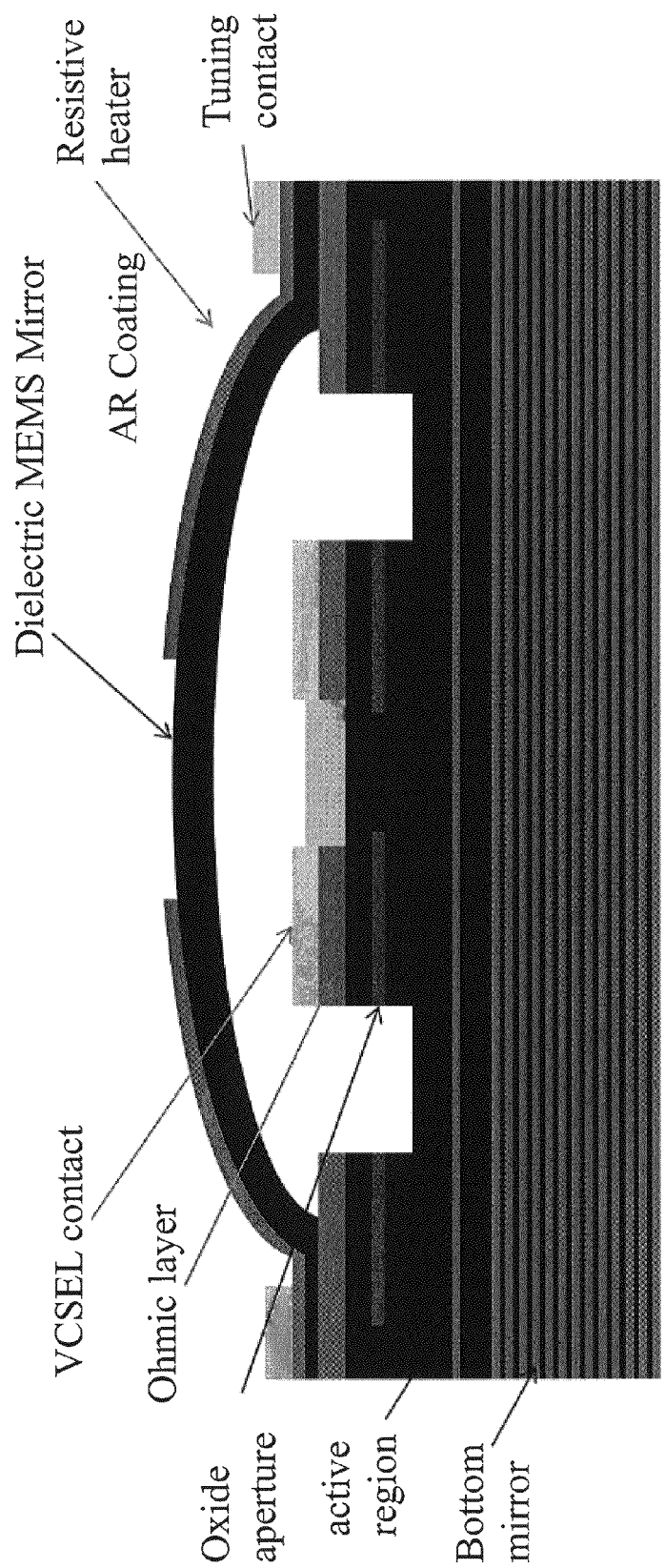
FIG. 16 is a diagrammatic cross section view of a structure arrangement for a movable-mirror dual aperture vertical-cavity surface-emitting laser according to still another embodiment.

FIG. 12 is a plot of the refractive index of an alternative structure in which the sacrificial layer and membrane are not included in the semiconductor epitaxial structure, but are added later in the fabrication process. Once again the figure shows the refractive index profile of the epitaxial structure starting from partway through the bottom mirror (left) to the top of the structure (right). The epitaxial structure ends after the current spreading layer and a contact layer. The contact layer can be removed from the optical path to reduce absorption, if desired. In this case the processed device could be designed as in FIG. 13. Current confinement may be provided to the structure using an implant 1301. The ohmic $p^{++}$ contact layer 1302 may be removed from the optical path. An AR (anti-reflective) coating 1303 may be added to the top of the structure in the optical path. Metal contacts may be made to the $p^{++}$ ohmic contact layer. In the embodiment shown, the sacrificial layer (shown partially removed) 1304 could be a polymer material (e.g. photoresist), a metal (e.g. aluminum), or an amorphous semiconductor (Germanium or Silicon). This sacrificial layer could be planarized after deposition to remove the underlying VCSEL topography. Alternatively, the sacrificial layer could have curvature incorporated into it by reflowing the photoresist after patterning, or etching in a way that creates a tapered profile (e.g., FIG. 14). In either embodiment of FIG. 13 or 14, before removing the sacrificial layer, a membrane layer may be deposited. The membrane could be a thin dielectric film, or it could be the full dielectric mirror structure 1305. Stress can be added to the membrane layer to cause the mirror to curve after the sacrificial layer is removed. Resistive metal or other high resistivity material can be deposited and patterned on top of the membrane to serve as the heating element 1306. FIGS. 15 and 16 illustrate variations of the embodiments of FIGS. 13 and 14 in which the current confining mechanism is an oxidation layer. In such embodiments, one or several trenches may be etched into the epitaxial structure so that the trench(es) reaches the high aluminum containing oxidation layer. This can be partially oxidized by putting the structure into a steam atmosphere. The oxidation may be timed to stop at a point which leaves an unoxidized area in the optical path of the laser.

FIG. 3B is a diagrammatic cross section view of a layered structure arrangement for a part of a wafer 302 for processing into movable-mirror dual-aperture vertical-cavity surface-emitting laser. Here, ion implantation has formed an aperture for the VCSEL in a layer above the MQW structure.

FIG. 3C is a diagrammatic cross section view of a layered structure arrangement for a part of a wafer 303 after deposition of top mirror structure 241. Here a multiple-layer dielectric mirror has been deposited and patterned. In some embodiments, this step is performed before that of FIG. 3B, in order to use the patterned first mirror 341 as a self-aligned mask for the aperture formation.

FIG. 3D is a diagrammatic cross section view of a layered structure arrangement for a part of a wafer 304 after trench-etching side wells 342. Here, wells 342 are etched for the processes of FIG. 3E and FIG. 3F.

FIG. 3E is a diagrammatic cross section view of a layered structure arrangement for a part of a wafer 305 after adding side-well protection 343. The sidewall protection protects the output membrane supports during the etching process of FIG. 3G to undercut the material under the first mirror 341.

FIG. 3F is a diagrammatic cross section view of a layered structure arrangement for a part of a wafer 306 after adding ohmic contacts 344. The ohmic contacts 344 later provide operating current through the aperture to the MQW gain medium for lasing.

FIG. 3G is a diagrammatic cross section view of a layered structure arrangement for a part of a wafer 307 after releasing membrane 345. The process here undercuts the sacrificial AlAs material under the mirror 341 and/or membrane 345.

FIG. 4A is a graph 401 having a plurality of curves of intensity as a function of wavelength for an experimental movable mirror setup (one curve for each of nine different voltages applied to the heating elements). For these measurements, no gain medium was used between the first and second mirrors. Nine different voltages were applied. The notch in the graph of the bottom 0-volt curve is at 650 nm. One can note that this notch moves to successively longer wavelengths until that notch on the curve at 0.30 volts is at a wavelength of 680 nm.

Figure 4B:
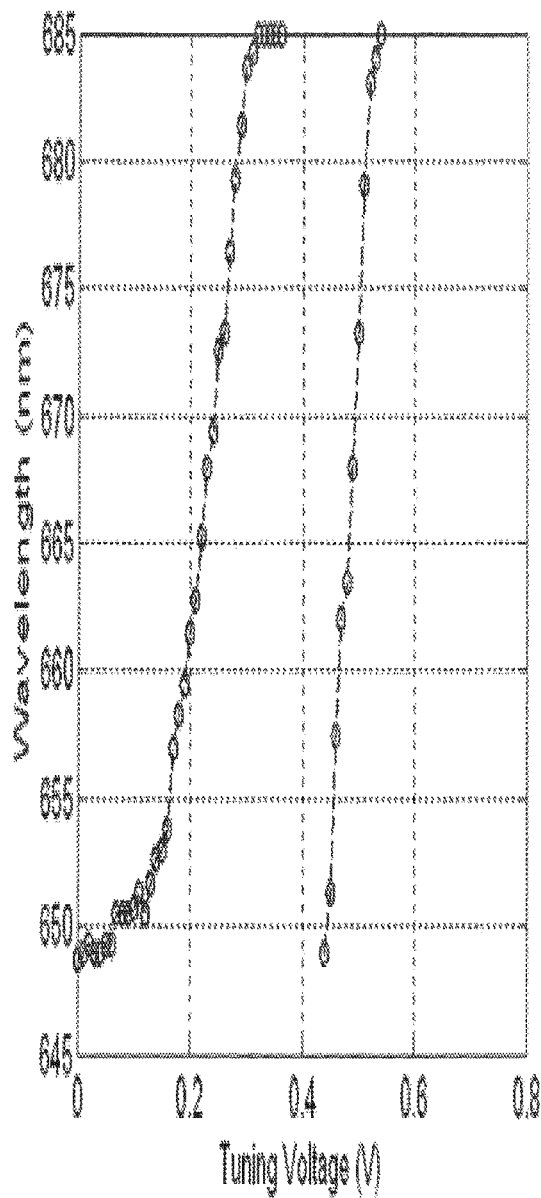
FIG. 4B is a graph 402 of resonant wavelength as a function of voltage for the experimental movable mirror setup.

FIG. 4B is a graph 402 of resonant wavelength (e.g., the wavelength of the notches of the curves of FIG. 4A) as a function of voltage across the resistive elements (e.g., reference element 252 of FIG. 2D) for the experimental movable mirror setup. Note that the resonant wavelength increases from about 648 nm at zero applied volts to about 685 nm at about 0.35 applied volts for the particular embodiment used to obtain these measurements. Note also that as the applied voltage continues to increase that the resonant wavelength moves to about 648 nm when the applied voltage is about 0.45 volts and then increases again along the curve shown until about 685 nm at about 0.52 applied volts for the particular embodiment used to obtain these measurements. In other embodiments, other geometries and gap sizes achieve resonant wavelengths across other suitable wavelength ranges, and are usable for VCSELs having lasing wavelengths from as short as 200 nm or shorter, to as long as 6000 nm or longer by suitable geometries and sizes.

Figure 4C:
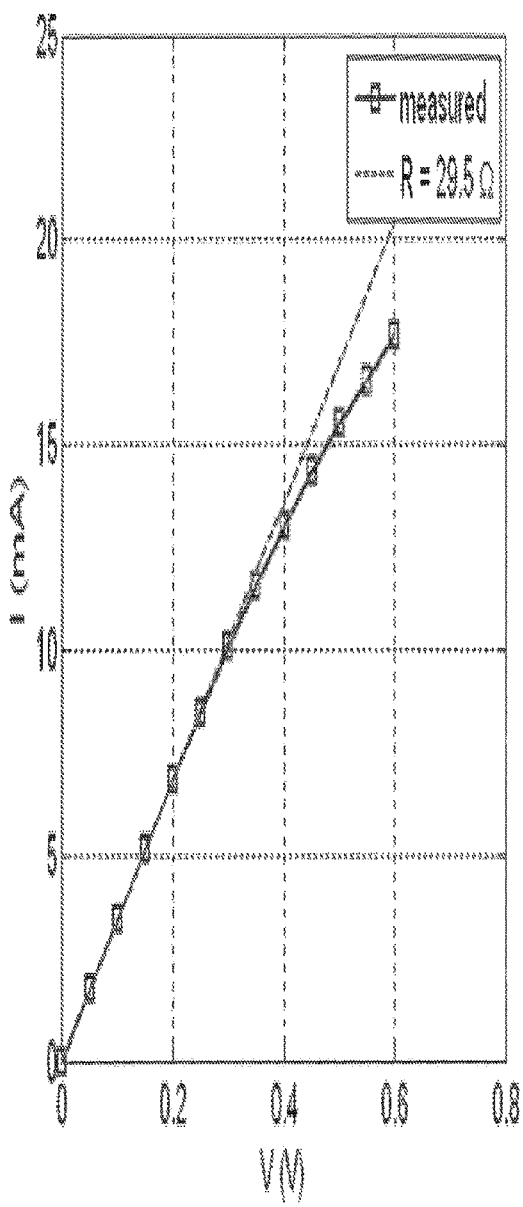
FIG. 4C is a graph 403 of current as a function of voltage for the experimental movable mirror setup.

FIG. 4C is a graph 403 of current as a function of voltage for the experimental movable mirror setup. This curve indicates a linear resistance (change in voltage divided by change in current) for lower voltages, and a slight deviation from that straight line ratio at higher voltages.

FIG. 5 is a table of features and advantages of various combinations of the present invention. In some embodiments, the present invention provides a monolithic device incorporating one or more VCSEL and their respective tuning elements on a single chip. In some embodiments, the movable top mirror is suspended over the VCSEL's gain medium and bottom mirror with an air space in between. In some embodiments, semiconductor arms are used connect the suspended mirror to the rest of the structure. In some embodiments, resistive heaters that include a higher resistance metal, such as NiCr or the like, are patterned on the connector arms and cause the arms to expand/contract and the mirror to move up/down relative to the bottom part of the structure; as the mirror moves, the VCSEL wavelength shifts to longer/shorter wavelengths. In some embodiments, the VCSEL's epitaxial structure includes a substrate, bottom semiconductor mirror, QW active layer (such as a multiple-quantum-well structure), etch stop, AlAs sacrificial layer, and AlGaAs membrane, each formed by epitaxial growth on the layer beneath. In some embodiments, processing includes ion implantation to form a current-confinement guide, depositing and patterning semiconductor mirror, trench etch, passivating outside sidewalls of trench, depositing ohmic metal contacts on top of active region, patterning the resistive metal on the top mirror connector arms, and etching the sacrificial layer to release the top mirror. Some embodiments also include thinning the wafer and depositing metal on its back side.

In contrast to the embodiments described above, in some embodiments, the expandable membrane 250 and first (top) mirror 241 are formed on a substrate (such as a silicon substrate 661 of FIG. 6E1 below) other than that used to build the other layers of the laser(s) in a single-laser device or in an array of lasers, such as shown below in the various figures. In some embodiments, a similar expandable membrane (e.g., 650 of FIG. 6E2 below, which in some embodiments, is formed as described above for membrane 250) is used to move other optical elements of the VCSEL system (e.g., lenses 630, in order to adjust a focus of the output beam) besides a first mirror 241.

In some embodiments, of all the embodiments described herein, additional components (such as housings, power supplies, control circuits and/or computational elements, sensors, vehicles and the like) are combined with the elements shown in order to form complete subsystems or systems. Likewise, some embodiments shown herein may include elements from other embodiments (and/or from the patent documents that are incorporated herein by reference) combined into the embodiments shown herein in order to achieve synergistic combinations that obtain their combined advantages.

Wafer-Scale Packaging Embodiments

FIG. 6A is a diagrammatic perspective top view of a structure arrangement for a device 601 made by wafer-scale packaging (WSP) according to some embodiments of the present invention. In some embodiments, device 601 includes a light-emitting-side transparent substrate 610 (e.g., in some embodiments, made of borosilicate glass) onto which a plurality of lenses 630 are formed on surface 614. On the opposite side from the lenses 630, a silicon substrate 620 is bonded to transparent substrate 610.

Figure 6D:
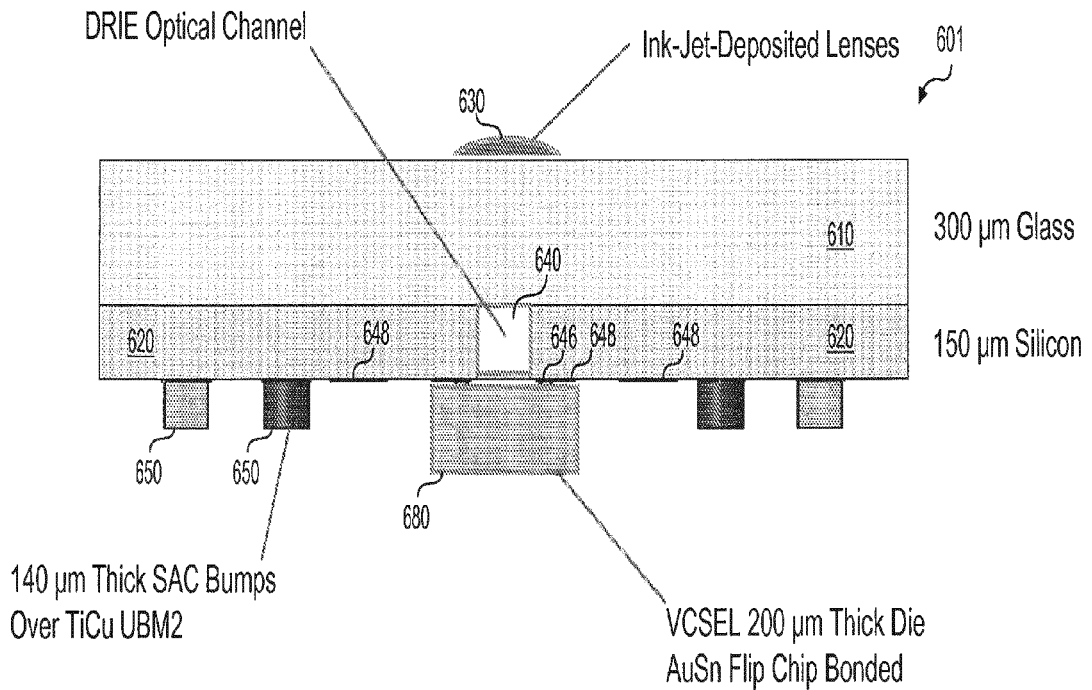
FIG. 6D is a diagrammatic cross-section side view of device 601 of FIG. 6A according to some embodiments of the present invention.

FIG. 6B is a diagrammatic perspective bottom view of device 601 of FIG. 6A according to some embodiments of the present invention. In some embodiments, the silicon substrate 620, which is bonded to transparent substrate 610, has a slot 640 (e.g., in some embodiments, formed by deep reactive ion etching (DRIE) or other suitable method) that is wider at its ends than in the middle. In other embodiments, it is not wider at its ends than in the middle. In some embodiments, making it wider at its ends than in the middle makes it easier to add index matching fluid or encapsulant to the device. Across the middle of slot 640 is a VCSEL chip 680 having its emitting face directing the output laser light through slot 640 towards and through lenses 630 (shown in FIG. 6A and FIG. 6C). Conductive traces 648 connect to bumps (e.g., in some embodiments, solder bumps or balls in a grid array (BGA)) on the VCSEL chip 680 and to the bumps 650 (e.g., in some embodiments, larger solder bumps or balls in a grid array (BGA) for connection to external packaging (not shown)). FIG. 6C is a diagrammatic perspective top view of device 601 of FIG. 6A according to some embodiments of the present invention, and FIG. 6D is a diagrammatic cross-section side view of device 601 of FIG. 6A according to some embodiments of the present invention.

FIG. 6E1 is a diagrammatic cross-section side view of a device 605 having the capability of hermetic sealing, according to some embodiments of the present invention. In some embodiments, device 605 has a silicon substrate cover 660 having a recess 662 (e.g., in some embodiments, a wet-etched cavity to enclose the VCSEL die 680), which is bonded to slotted silicon substrate. In some embodiments, the seal provides a hermetically sealed package around the VCSEL chip die 680. In some embodiments, fiducial marks are provided on substrate 620, substrate 660 and/or glass substrate 610 to assist in aligning these relative to one another. In some embodiments, solder balls 664 on pads 666 provide electrical connections to external PCBs or other packaging, and electrically connect to through-vias 668 and to bonding pads 670 and 671, that connect to the VCSEL chip 680 and/or other internal electronics and/or sensors within the sealed volume of the package. In some embodiments, a solder seal ring 674 runs circumferentially around the enclosed components (e.g., in some embodiments, near the edges of the device) in order to hermetically seal and adhesively hold the parts together. In some embodiments, the seal is not hermetic, but is used to exclude most environmental contaminants.

FIG. 6E2 is a diagrammatic cross-section side view of a device 6051 having the capability of adjustable wavelength tuning and/or adjustable focussing lenses in addition to or in place of the hermetic sealing of FIG. 6E1, according to some embodiments of the present invention. In some embodiments, device 6051 has a silicon substrate cover 660 having a recess 662 (e.g., in some embodiments, a wet-etched cavity to enclose the VCSEL die 680), which is bonded to a first slotted silicon substrate 665. In some embodiments, the seal 674 provides a hermetically sealed package around the VCSEL chip die 680. In some embodiments, fiducial marks are provided on substrate 620, substrate 660 and/or glass substrate 610 to assist in aligning these relative to one another. In some embodiments, solder balls 664 on pads 666 provide electrical connections to external PCBs or other packaging, and electrically connect to throughvias 668 and to bonding pads 670 and 671, that connect to the VCSEL chip 680 and/or other internal electronics and/or sensors within the sealed volume of the package. In some embodiments, additional solder balls 664 on pads 666 provide electrical connections to external PCBs or other packaging, and electrically connect to throughvias 668 and to bonding pads 672 and 673, that connect to the VCSEL tuning membrane(s) 250 that move the external first mirrors 241 and/or other internal electronics and/or sensors within the sealed volume of the package. In some embodiments, additional adjustable membranes 650 can be used to move lenses 630 towards and away from the VCSEL array 680 to independently or concurrently adjust a focus on each individual lens 630 and its corresponding laser or lasers. In some embodiments, electrical connections 675 and 676 connect to external circuitry. In some embodiments, electrical connections 675 and 676 also electrically connect to throughvias 668 and to bonding pads 672 and 673 that connect to the VCSEL focusing membrane(s) 650 that move the external lenses 630 and/or other external optical elements outside the sealed volume of the package 6051.

FIG. 6F is another diagrammatic perspective bottom view of device 601 of FIG. 6A according to some embodiments of the present invention. FIG. 6G is photomicrograph bottom view of a device 606 according to some embodiments of the present invention. In some embodiments, device 606 is a physical embodiment of the device 601, but implemented with just six lenses. FIG. 6H is photomicrograph top view of device 606 of FIG. 6G according to some embodiments of the present invention.

FIG. 7A is an enlarged photomicrograph top view focussed on apertures of device 606 of FIG. 6G according to some embodiments of the present invention. In some embodiments, the grid array of lenses (six of which are shown here) are implemented on a staggered pitch having a center-center spacing of 100 microns in the long dimension of the array. FIG. 7B is an enlarged photomicrograph top view focussed on the VCSELs of device 606 of FIG. 7A according to some embodiments of the present invention. FIG. 7C is an enlarged photomicrograph top view focussed on "relay" images of the VCSELs of device 606 of FIG. 7A according to some embodiments of the present invention. FIG. 7D is a further-enlarged photomicrograph top view of an individual lens of device 606 of FIG. 7A according to some embodiments of the present invention. FIG. 7E is a scanned-topographical image perspective view of an individual lens of device 606 of FIG. 7A according to some embodiments of the present invention.

FIG. 8 is a table of features and advantages of various combinations of the present invention having wafer-scale packaging (WSP). In some embodiments, the wafer scale package provides the capability of thousands of packages fabricated simultaneously on a silicon wafer. In some embodiments, the slotted silicon wafer is bonded to glass wafer, wherein the glass wafer carries the lenses. In some embodiments, a slot is etched into the silicon wafer to allow the light from the VCSEL to pass through the silicon wafer and then through the transparent glass and lenses. The etched slot also allows us to inject a transparent encapsulant to protect the surface of the VCSEL chip. In some embodiments, lenses are fabricated by inkjet printing of bumps of a liquid polymer that is then hardened to an array of transparent lenses. In some other embodiments, lenses are fabricated by etching into the glass to form refractive or diffractive lenses. In other embodiments, a holograph process is used to form focusing elements.

In some embodiments, each lens could either be a refractive or diffractive lens. The VCSEL die has a single laser in some embodiments, or an array of lasers in other embodiments, and is bump-bonded to the silicon wafer while the silicon is still in wafer form. After sawing the silicon wafer into individual packages, the silicon package can be surface mounted to the board (another bump bond). In some embodiments, the lenses are aligned to the VCSELs with photolithographic precision at the wafer scale. In some embodiments, the package can be made hermetic (e.g., efficiently sealed such that not even helium could pass) by using a second silicon wafer with a well etched into it for each VCSEL chip and with through-wafer contacts.

Scanner Embodiments

FIG. 9A is a diagrammatic perspective top view of a structure arrangement for a device 901 using packaging suitable for VCSELs used in scanning applications, according to some embodiments of the present invention; FIG. 9B is a diagrammatic perspective bottom view of a structure arrangement for device 901, according to some embodiments of the present invention; and FIG. 9C is a diagrammatic exploded perspective bottom view of a structure arrangement for device 901, according to some embodiments of the present invention.

Referring to FIG. 9A, FIG. 9B and FIG. 9C, in some embodiments, device 901 emits light from the emitting face of lenses element 912 along a line 910. In some embodiments, lenses element 912 includes a plurality of side-by-side GRIN lenses 940 (see FIG. 9D) and is mounted in a holder to form a GRIN-lens array 920. The holder is mounted to bottom cover 926 and can be attached where needed using screws 922. VCSEL encapsulation plate 924 includes the VCSELs on circuit board 925, and connector 928 allows cable 930 to connect signals from its wires 932 to the VCSEL plate 924. Screws 927 affix the bottom cover, circuit board 925 and VCSEL encapsulation plate 924 to GRIN-lens array 920.

FIG. 9D is a diagrammatic enlarged top view of a structure arrangement for GRIN-array device 904 using packaging suitable for scanning applications, according to some embodiments of the present invention. In some embodiments, GRIN-array device 904 is used for GRIN-lens array 920 of device 901 of FIG. 9A.

FIG. 9E is a diagrammatic enlarged top view of a structure arrangement for device 905 using packaging suitable for scanning applications, according to some embodiments of the present invention. In some embodiments, a plurality of individual VCSELs 952 are formed in a zig-zag or staggered arrangement, while in other embodiments, the VCSELs 952 are arranged in a straight line and the electrical connections 950 to the individual VCSELs are formed in a zig-zag or staggered arrangement. In some embodiments, the VCSELs are spaced such that the VCSEL-VCSEL spacing across neighboring chips is substantially equal to the on-chip VCSEL-VCSEL spacing. Cleaving the ends of the VCSEL chips allows clean breaks and closely spaced joints between neighboring chips.

Figure 9F:
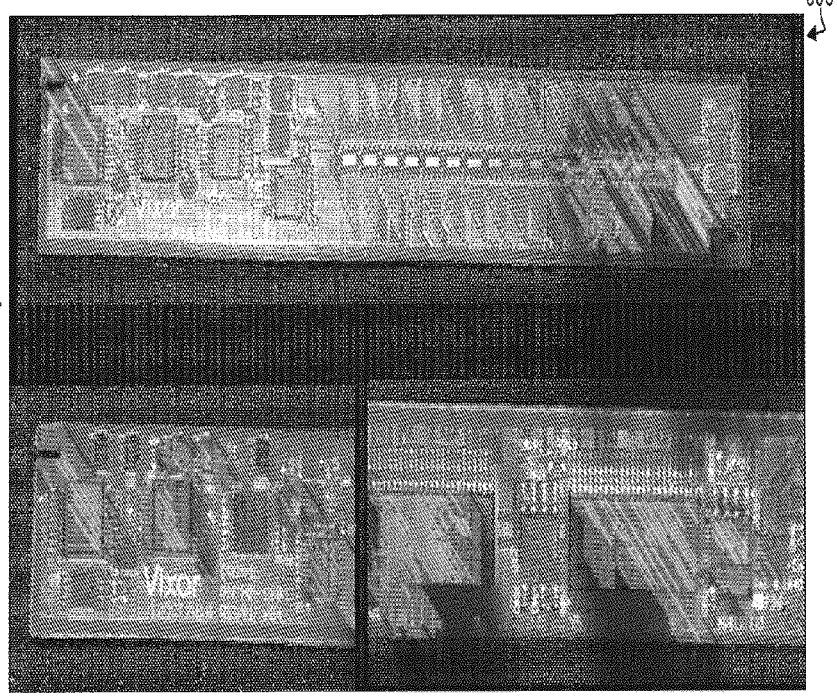
FIG. 9F is a photograph of a device 906 using packaging suitable for scanning applications, according to some embodiments of the present invention.
Figure 9G:
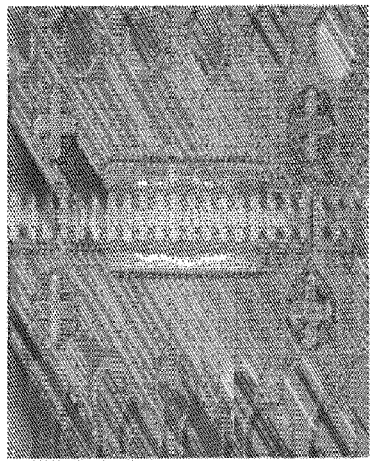
FIGS. 9G and 9H are enlarged photomicrographs of device 906, according to some embodiments of the present invention.
Figure 9H:
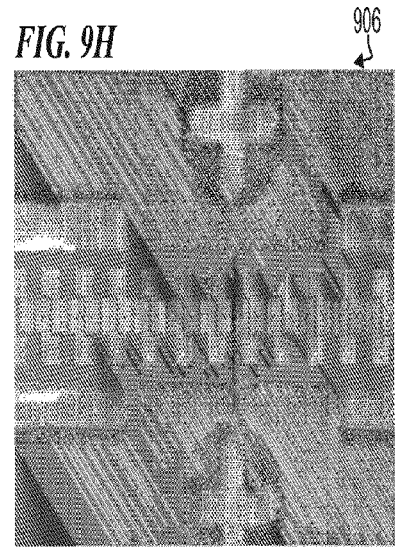

FIG. 9F is a photograph of a device 906 using packaging suitable for scanning applications, according to some embodiments of the present invention. FIGS. 9G and PH are enlarged photomicrographs of device 906, according to some embodiments of the present invention.

FIG. 10 is a table of features and advantages of various combinations of the present invention, describing aspects of devices and packaging for subsystems suitable for scanning applications and the like. In some embodiments, this uses VCSEL arrays (in some embodiments, a VCSEL arrangement of 1×8, 1×16, 1×32, or 1×64 VCSELs is optimal). In some embodiments, the VCSEL arrays are placed end to end in a line directly on a board; the pitch is maintained across chip edges to better than 10 μm (10 microns). In some embodiments, alignment marks on the chips and alignment marks on the board allow the chips to be placed so that the VCSEL to VCSEL alignment remains constant across chip edges. In some embodiments, the VCSEL chips are either sawn or cleaved in the long direction, and are cleaved in the short direction to enable them to be placed close together on the board. In some embodiments, a GRIN lens array is aligned to the VCSELs to focus the beam; the GRIN lens array is imaging so that all light from a given VCSEL is focussed to the same spot, regardless of which lens the light travelled through. In some embodiments, a matrix addressing driver scheme allows each VCSEL to be turned on sequentially. In some embodiments, a 100 μm (100 microns) pitch is maintained.

In the foregoing description various embodiments of the present disclosure have been presented for the purpose of illustration and description. They are not intended to be exhaustive or to limit the invention to the precise form disclosed. Obvious modifications or variations are possible in light of the above teachings. The various embodiments were chosen and described to provide the best illustration of the principals of the disclosure and their practical application, and to enable one of ordinary skill in the art to utilize the various embodiments with various modifications as are suited to the particular use contemplated. All such modifications and variations are within the scope of the present disclosure as determined by the appended claims when interpreted in accordance with the breadth they are fairly, legally, and equitably entitled.

We claim:

1. A VCSEL apparatus comprising:
a solid-state gain medium;
a first reflective mirror on one side of the solid-state gain medium;
a second reflective mirror on an opposite side of the solid-state gain medium; and
a membrane operably connected to the second reflective mirror, wherein the membrane comprises a material that expands when one of heated or cooled causing the second reflective mirror to move so as to tune a characteristic wavelength of the VCSEL apparatus.

2. The VCSEL apparatus of claim 1, further comprising a sacrificial layer between the membrane and the solid-state gain medium.

3. The VCSEL apparatus of claim 2, wherein the sacrificial layer is patterned with a curvature.

4. The VCSEL apparatus of claim 1, wherein the membrane is at least partially patterned with a resistive material for receiving a current therethrough.

5. The VCSEL apparatus of claim 4, wherein the membrane moveably suspends the second reflective mirror over the first reflective mirror and solid-state gain medium with an air space underneath the suspended second reflective mirror.

6. The VCSEL apparatus of claim 4, wherein a current through the resistive material heats the membrane, causing the membrane to expand and move the second reflective mirror further away from the first reflective mirror, thereby tuning the wavelength of the VCSEL apparatus.

7. The VCSEL apparatus of claim 6, wherein the first and second reflective mirrors each comprise a distributed-Bragg-reflector (DBR) and the solid-state gain medium comprises a multiple-quantum-well (MQW) structure.

8. The VCSEL apparatus of claim 4, wherein the current through the resistive material can be varied to correspondingly vary a deformation of the membrane and position of the first reflective mirror with respect to the second reflective mirror, and thus vary the wavelength of the VCSEL apparatus.

9. The VCSEL apparatus of claim 4, wherein the membrane comprises a plurality of arms forming a lens shape, at the top of which the second reflective mirror is connected.

10. The VCSEL apparatus of claim 4, further comprising an ion implant to confine an excitation current of the VCSEL.

11. The VCSEL apparatus of claim 4, further comprising an oxide layer to confine an excitation current of the VCSEL.

12. The VCSEL apparatus of claim 1, wherein the membrane comprises a resistive material for receiving a current therethrough and expanding when one of heated or cooled.

13. The VCSEL apparatus of claim 12, wherein the resistive material comprises at least one of AlGaAs and NiCr.

14. The VCSEL apparatus of claim 12, wherein the current through the resistive material can be varied to correspondingly vary a deformation of the resistive material and position of the first reflective mirror with respect to the second reflective mirror, and thus vary the wavelength of the VCSEL apparatus.

15. The VCSEL apparatus of claim 14, wherein the resistive material comprises a plurality of arms forming a lens shape, at the top of which the second reflective mirror is connected.

16. The VCSEL apparatus of claim 14, further comprising an ion implant to confine an excitation current of the VCSEL.

17. The VCSEL apparatus of claim 14, further comprising an oxide layer to confine an excitation current of the VCSEL.

18. The VCSEL apparatus of claim 12, wherein the first and second reflective mirrors each comprise a distributed-Bragg-reflector (DBR) and the solid-state gain medium comprises a multiple-quantum-well (MQW) structure.

* * * * *